(12) United States Patent
Jin et al.

(10) Patent No.: US 12,411,159 B2
(45) Date of Patent: Sep. 9, 2025

(54) APPARATUS AND METHOD FOR CLOCK FREQUENCY ESTIMATION WITH LEAST SQUARES METHOD

(71) Applicant: Microchip Technology Incorporated, Chandler, AZ (US)

(72) Inventors: Gary Qu Jin, Kanata (CA); Kamran Rahbar, Kanata (CA)

(73) Assignee: Microchip Technology Incorporated, Chandler, AZ (US)

( * ) Notice: Subject to any disclaimer, the term of this patent is extended or adjusted under 35 U.S.C. 154(b) by 30 days.

(21) Appl. No.: 18/581,574

(22) Filed: Feb. 20, 2024

(65) Prior Publication Data
US 2025/0180614 A1   Jun. 5, 2025

Related U.S. Application Data

(60) Provisional application No. 63/604,992, filed on Dec. 1, 2023.

(51) Int. Cl.
*G01R 23/10* (2006.01)
*H03K 3/0231* (2006.01)
(Continued)

(52) U.S. Cl.
CPC ........... *G01R 23/10* (2013.01); *H03K 3/0231* (2013.01); *H03K 21/10* (2013.01); *H03K 21/40* (2013.01)

(58) Field of Classification Search
CPC ........ G01R 23/02; G01R 23/04; G01R 23/10; H03K 21/08; H03K 21/10; H03K 21/40; H03K 3/0231
(Continued)

(56) References Cited

U.S. PATENT DOCUMENTS 5,019,823 A  *  5/1991   Bream ................... G01R 23/12
                                                       342/175
7,133,791 B1    11/2006  Su .................................. 702/89
(Continued)

FOREIGN PATENT DOCUMENTS

EP    0373802 A2    6/1990    ............. G01R 23/02
JP    6173106 B2    8/2017    ............. G01R 23/10

OTHER PUBLICATIONS

Bode, Peter et al., "Improved Method for Measuring Frequency Ratios in GSM Mobile Phones," IEEE 2004 Custom Integrated Circuits Conference, 4 pages, Oct. 3, 2004.
(Continued)

*Primary Examiner* — William Hernandez
(74) *Attorney, Agent, or Firm* — SLAYDEN GRUBERT BEARD PLLC

(57) ABSTRACT

An apparatus includes a clock signal input, a sampling circuit, and an estimation circuit. The clock signal input receives N time measurements. A time measurement denotes a respective portion of a given cycle of a clock signal. The sampling circuit is to generate a first sampled window from the clock signal input. The first sampled window includes an accumulation of the N time measurements. The sampling circuit is to generate a second sampled window from the clock signal input including an accumulation of a plurality of products. The estimation circuit is to estimate the frequency or period of the clock signal based upon the first sampled window and the second sampled window.

16 Claims, 20 Drawing Sheets

(51) Int. Cl.
*H03K 21/10* (2006.01)
*H03K 21/40* (2006.01)

(58) Field of Classification Search
USPC .................................................. 327/24, 113
See application file for complete search history.

(56) References Cited

U.S. PATENT DOCUMENTS

| | | | |
|---|---|---|---|
| 7,222,035 B1 * | 5/2007 | Zhodzishsky | G01S 19/23 |
| | | | 342/357.68 |
| 9,860,085 B1 | 1/2018 | Pettijohn et al. | |
| 2006/0155491 A1 | 7/2006 | Bode | 702/75 |
| 2010/0141240 A1 | 6/2010 | Hutchinson | 324/76.39 |
| 2011/0087449 A1 | 4/2011 | Haartsen et al. | 702/89 |
| 2011/0301895 A1 | 12/2011 | Miyahara | 702/72 |
| 2013/0322579 A1 * | 12/2013 | Kumar | H04L 27/2676 |
| | | | 375/343 |
| 2016/0079961 A1 | 3/2016 | Jin | 708/300 |
| 2018/0191489 A1 * | 7/2018 | Banin | H03L 7/08 |

OTHER PUBLICATIONS

International Search Report and Written Opinion, Application No. PCT/US2024/031947, 14 pages, Sep. 19, 2024.

International Search Report and Written Opinion, Application No. PCT/US2024/031977, 14 pages, Sep. 19, 2024.

International Search Report and Written Opinion, Application No. PCT/US2024/032220, 15 pages, Sep. 19, 2024.

* cited by examiner

APPARATUS AND METHOD FOR CLOCK FREQUENCY ESTIMATION WITH LEAST SQUARES METHOD

RELATED APPLICATIONS

This application claims priority to U.S. provisional application Ser. No. 63/604,992, filed on Dec. 1, 2023, the disclosure of which is incorporated by reference in its entirety for all purposes.

FIELD OF THE INVENTION

The present disclosure relates to clock signals of electronic devices and, more particularly, to an apparatus and method for clock frequency estimation with a least squares method.

BACKGROUND

Clock frequency estimation is used in many electronic systems. Accurate clock frequency estimation seeks to minimize the error involved in such estimations. The accuracy of the clock estimation may be related to N, the number of clock edges that are observed to estimate the constituent clock frequency. One estimation method may be considered more accurate than another estimation method if the error is statistically reduced between estimation methods by increasing the value of N.

Existing solutions such as the one illustrated in FIG. 1 may implement a brute-force calculation of average clock period T during a sample period $T_s$ as in the following equation:

$$T = \frac{t_{N-1} - t_0}{N} \quad \text{equation 1}$$

where $t_{N-1}$ is the time at the end of the sample period, to is the time at the beginning of the sample period, and N is the number of measured clock periods during the sample period. The estimation error, ε, of this calculation may be given as $$\epsilon^2 = \frac{2\sigma^2}{N^2} \quad \text{equation 2}$$

where each clock rising edge has independent measurement noise with variance of σ^2. These noises include input clock noise, input clock wander, input clock jitter, sample clock noise, sample clock wander, sample clock jitter, resolution, and inherent limitations of the estimation. The estimation error decreases with increasing measurement window $T_s$, with its commensurate increase in N. The error reduction is proportional to 1/N^2.

The clock frequency may be computed as the inverse of clock period T. As such, estimation of a clock period may be equivalent to estimation of a clock frequency. However, such brute-force solutions may involve large and complex circuitry, or much memory or processor time.

Simpler solutions may compute a cycle-by-cycle frequency. However, these may introduce a large error.

Examples of the present disclosure may address one or more of these issues.

DETAILED DESCRIPTION

Figure 2:
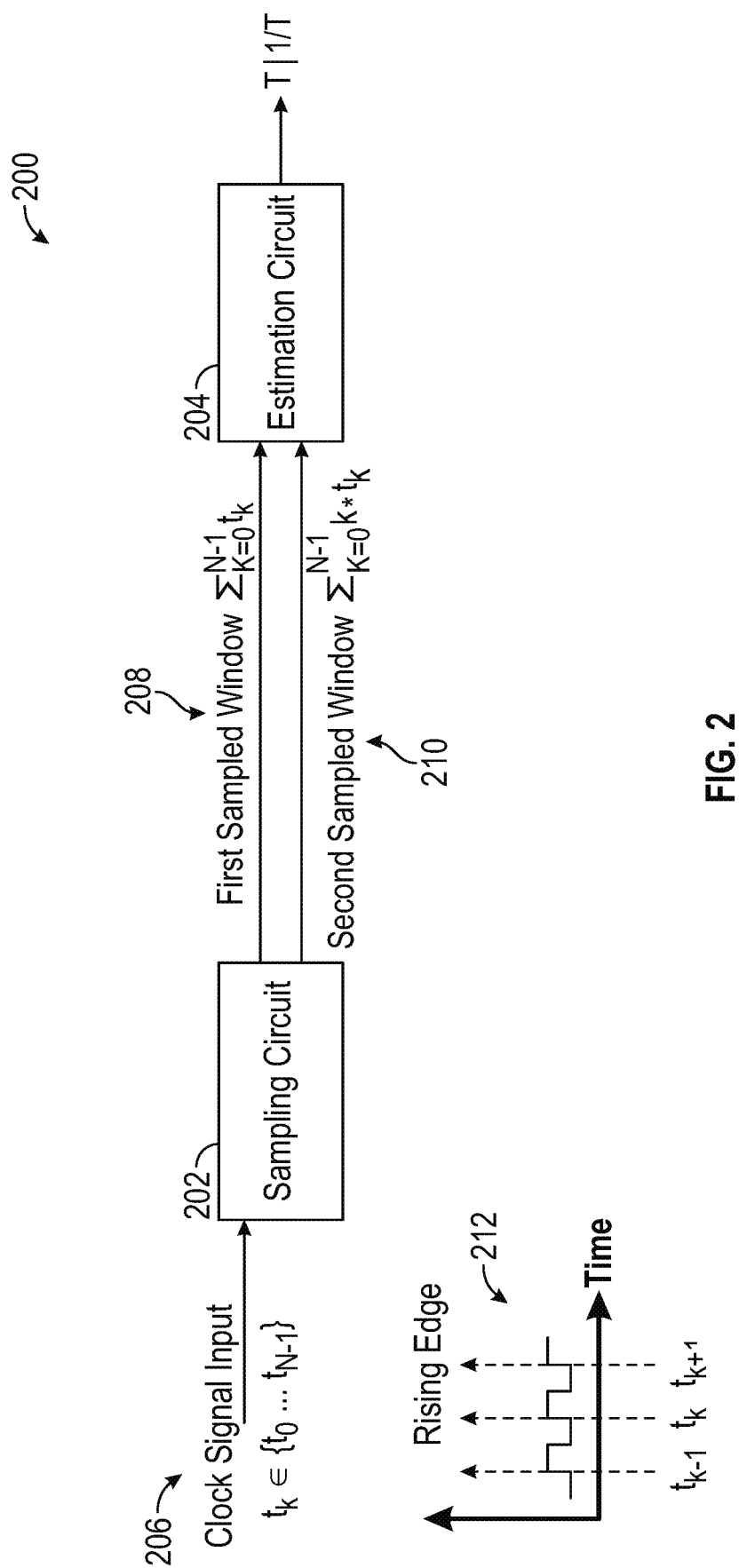
FIG. 2 is an illustration of an apparatus for estimating a clock cycle or period according to a least squares method, according to examples of the present disclosure.

FIG. 2 is an illustration of an apparatus 200 for estimating a clock cycle or period according to a least squares method, according to examples of the present disclosure.

A clock period may be estimated based on making time measurements of individual clock periods or cycles over a predetermined time or for a predetermined number of periods or cycles. The time measurement of a given clock period or cycle may be made at a respective time of a respective portion of a given cycle or period of a clock signal, such as the rising edge or the falling edge of a clock signal. In the examples of the present disclosure, a rising edge may be used as the example time of an example portion of a given cycle or period of a clock cycle at which to make a time measurement, however this is not meant to be limiting in any way, and the falling edge may be used without exceeding the scope of the present disclosure. Furthermore, in examples of the present disclosure, such a time measurement may be already made using any suitable mechanism (not shown). Upon each such rising edge, for example, a time measurement of the rising edge may be made. The measurement of such a time may be made with a frequency that is sufficiently fast compared to the expected range of frequencies of the clock signal to be estimated. Moreover, the examples of the present disclosure may operate with a frequency or internal clock (not shown) that is sufficiently fast compared to the expected range of frequencies of the clock signal to be estimated. The time measurement of a given rising edge of the clock signal to be estimated may be given as $t_k$. If N clock periods are to be measured, and thus N time measurements of a clock signal are to be made in order to estimate the frequency or period of the clock signal, $t_k$ may be given as $t_k \in \{t_0 \ldots t_{N-1}\}$. Each $t_k$ may thus represent the time at which a given measurement was made of the clock signal to be estimated.

The estimation of the clock period as performed by apparatus 200 using a least squares method may be defined as $$\hat{T} = \frac{12 \sum_{k=0}^{N-1} kt_k - 6(N-1)\sum_{k=0}^{N-1} t_k}{N(N^2-1)} \quad \text{equation 3}$$

Equation 3 may be derived from the least-squares approximation method.

Apparatus 200 may be implemented in any suitable manner and within any suitable larger components or contexts. For example, apparatus 200 may be implemented within a microchip, microcontroller, clock regulation circuit, a system on a chip, or within any other suitable mechanism.

Figure 1:
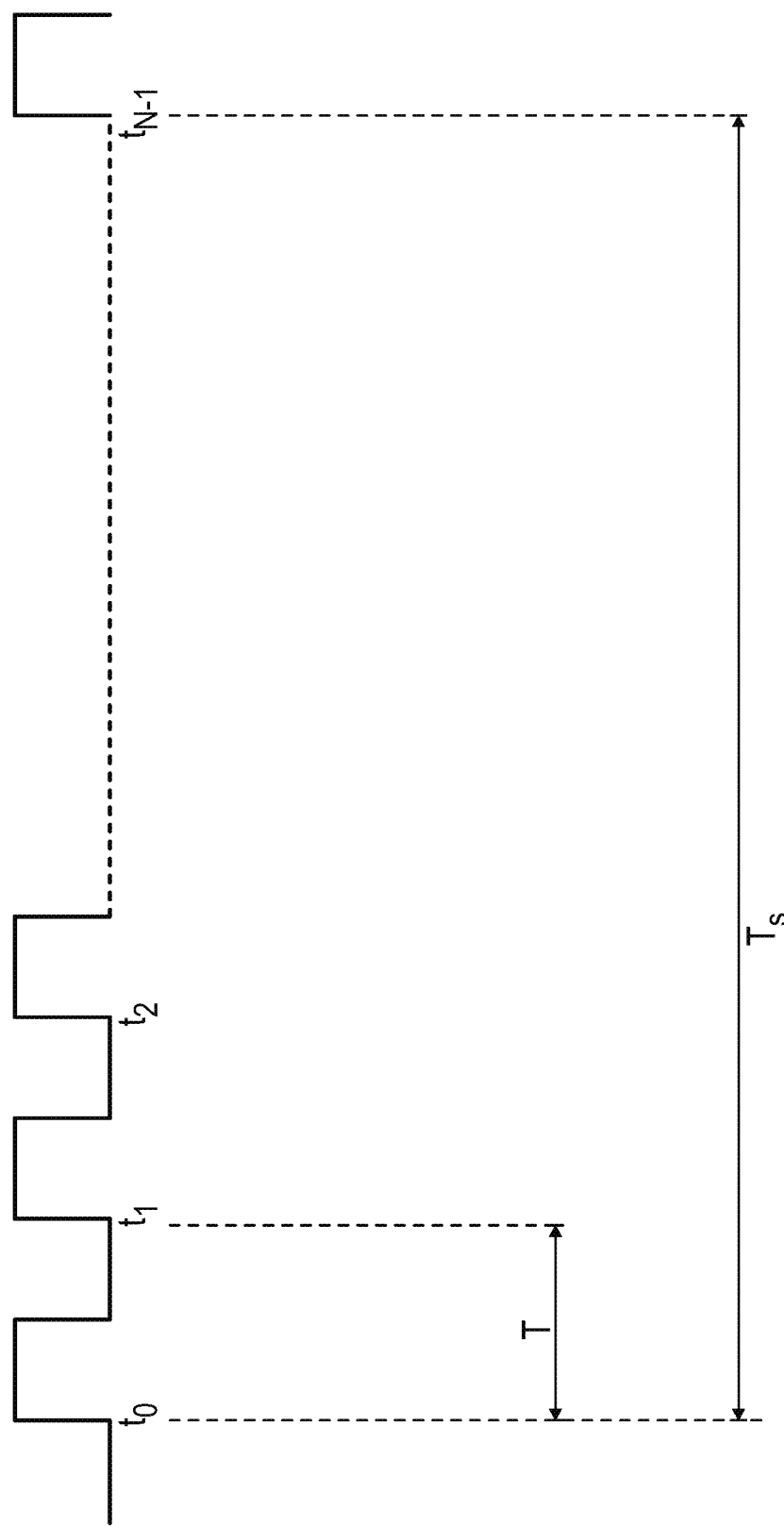
FIG. 1 is an illustration of a brute-force calculation of average clock period T during a sample period $T_s$.

Apparatus 200 may include a clock signal input 206 on which time measurements may be received. To estimate the frequency or period of a clock signal 212 (see also FIG. 1), N time measurements may be received on clock signal input 206. The N time measurements may be received one at a time as they are measured from clock signal 212. Each time measurement, denoted by $t_k$, may arise from a respective time of a respective portion of a given clock cycle of clock signal 212 to be measured. For example, each $t_k$ may be generated upon a rising edge of clock signal 212. Each $t_k$ may thus arrive at apparatus 200 upon a rising edge of clock signal 212. Each $t_k$ may arrive on clock signal input 206 in a serial or sequential manner, after the rising edge of clock signal 212.

Apparatus 200 may include a sampling circuit 202 and an estimation circuit 204 to generate an estimated frequency or period of clock signal 212 based upon the time measurements received on clock signal input 206. Sampling circuit 202 and estimation circuit 204 may be implemented in any suitable manner, such as by analog circuitry, digital circuitry, programmable logic, instructions for execution by a processor, an application specific integrated circuit, a field programmable gate array, or any suitable combination thereof. Although the present disclosure describes certain components and functions of sampling circuit 202 and estimation circuit 204, respectively, variations may be implemented where some components or functions of sampling circuit 202 or estimation circuit 204 may be included in or performed by the other of sampling circuit 202 and estimation circuit 204.

The received $t_k$ may be received by a sampling circuit 202, which may sample $t_k$. In various examples, sampling circuit 202 may selectively sample $t_k$, wherein certain samples may be skipped, as discussed further below. From the received time measurements included in the various received $t_k$, and after N such time measurements have been received (that is, $t_0$ through $t_{N-1}$), sampling circuit 202 may output a first sampled window 208 and a second sampled window 210 to estimation circuit 204.

First sampled window 208 may include an accumulation of the N time measurements received on clock signal input 206 from N consecutive measurements made of clock signal 212 by sampling circuit 202. The accumulation may be performed in any suitable manner, such as by an accumulator.

Second sampled window 210 may include an accumulation of products. The products may each be a product of a respective factor and a respective one of the N time measurements received on clock signal input 206 from N consecutive measurements made of clock signal 212. The respective factors may each be the same or different. At least one of the respective factors may be greater than one. For example, the respective factor may be an index of the given time measurement. Thus, the given product may be the value $(k*t_k)$. The accumulation may be performed in any suitable manner, such as by an accumulator.

Sampled windows 208, 210 may correspond to the generation of components of equation 3. For example, first sampled window 208 may be the term $\Sigma_{k=0}^{N-1} t_k$ and second sampled window 210 may be the term $\Sigma_{k=0}^{N-1} t_k$. The factors 12 or 6 to these terms as shown in equation 3 may be applied by sampling circuit 202 or may be applied by estimation circuit 204.

Estimation circuit 204 may estimate the frequency or period of clock signal 212 from sampled windows 208, 210. Estimation circuit 204 may make such an estimate in any suitable manner, such as with a least squares estimation. Estimation circuit 204 may make such an estimate according to, for example, equation 2. Estimation circuit 204 may thus produce a value T for the estimated frequency of clock signal 212, or a frequency, given by 1/T for the estimated frequency of clock signal 212.

Figure 3:
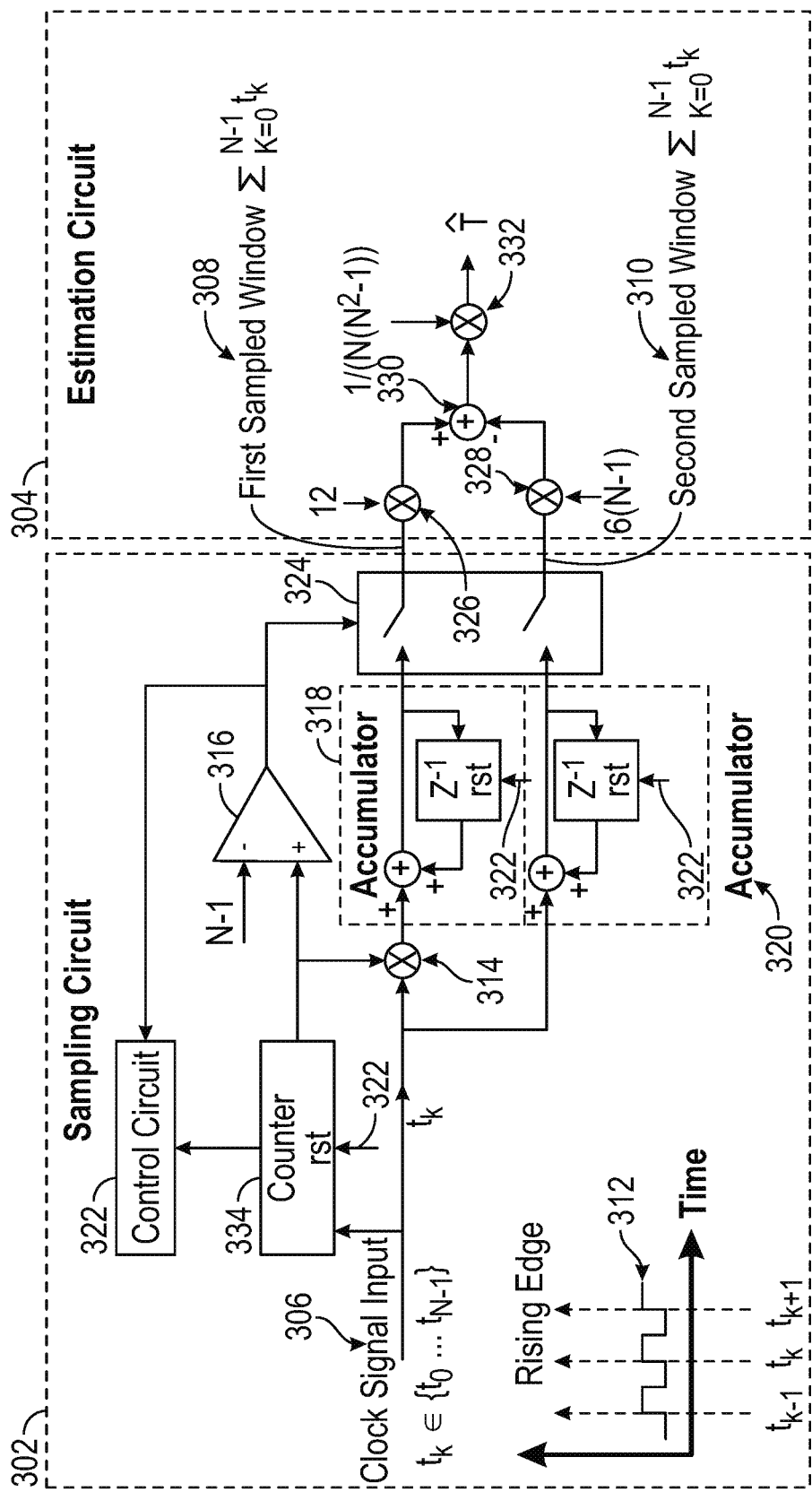
FIG. 3 is a more detailed illustration of an apparatus for estimating a clock cycle or period according to a least squares method, according to examples of the present disclosure.

FIG. 3 is a more detailed illustration of an apparatus 300 for estimating a clock cycle or period according to a least squares method, according to examples of the present disclosure. Apparatus 300 may be a more detailed implementation of apparatus 200. Apparatus 300 may include a clock signal input 306 corresponding to clock signal input 206, a sampling circuit 302 corresponding to sampling circuit 202, a first sampled window 308 corresponding to first sampled window 208, a second sampled window 310 corresponding to second sampled window 210, and may estimate a frequency or a period of clock signal 312, clock signal 312 corresponding to clock signal 212.

Apparatus 300 may include control circuit 322. Control circuit 322 may orchestrate or control various aspects of apparatus 300 to provide the correct order of operations of the components so as to estimate the frequency or period of clock signal 312. Control circuit 322 may be implemented in any suitable manner, such as by analog circuitry, digital circuitry, programmable logic, instructions for execution by a processor, an application specific integrated circuit, a field programmable gate array, or any suitable combination thereof.

Sampling circuit 302 of apparatus 300 may include a counter 334. Counter 334 may be implemented in any suitable manner, such as a count-up counter, count-down counter, or timer. Counter 334 may count a quantity of time measurements $t_k$ that have arrived on clock signal input 306 to make a given estimation of frequency or period of clock signal 312. Counter 334 may thus increment an index k of the quantity of the N time measurements. For each clock cycle of clock signal 312, counter 334 may increment k as the index of received time measurements. The value of k may be used as the respective factor to generate first sampled window 308 and second sampled window 310. Counter 334 may be reset by control circuit 322 upon making a new estimation for clock signal 312. Counter 334 may count the cycles of clock signal 312. The output of counter 334 may be controlled by control circuit 322 so as to be an integer value between zero and N−1, wherein N is the total number of input clock cycles for which the frequency or period of clock signal 312 is to be estimated.

Apparatus 300 may include multipliers 314, 326, 328, and adder 330. Each of these mechanisms may be implemented in any suitable manner. Multiplier 314 may be part of sampling circuit 302, and multipliers 326, 238 and adder 300 may be part of estimation circuit 304.

Sampling circuit 302 of apparatus 300 may include a first accumulator 318 and a second accumulator 320. Accumulators 318, 320 may be implemented in any suitable manner, such as by analog circuitry, digital circuitry, programmable logic, instructions for execution by a processor, an application specific integrated circuit, a field programmable gate array, or any suitable combination thereof. Specifically, accumulators 318, 320 may be implemented by an adder accepting one input to be accumulated, and one input from a delay circuit (denoted as the block labeled Z^−1) routed in feedback from the output of the respective adder. The delay circuit may include a register or other storage for holding the running total of previous accumulated inputs.

Clock signal input 306 may be multiplied with the currently produced index of counter 334 by multiplier 314. This may be performed in sampling circuit 302 each time a new clock signal input 306 arrives. Thus, the given respective factor used to generate a given product to be accumulated by second accumulator 320 may be k. This product may be provided to second accumulator 320 to accumulate the product $k*t_k$. Thus, a running total of products may be accumulated in second accumulator 320 to generate second sampled window 310 as its output.

Clock signal input 306 may be provided in parallel to first accumulator 318. First accumulator 318 may accumulate a given time measurement $t_k$ as it is received on clock signal input 306. Thus, the given time measurement $t_k$, as it is received on clock signal input 306 may be accumulated into a running total of the N time measurements to generate first sampled window 308.

Sampling circuit 302 of apparatus 300 may include a comparator 316. Comparator 316 may be implemented in any suitable manner. Comparator 316 may compare the output of counter 334 with the quantity N−1 to determine whether N time measurements have been received.

Sampling circuit 302 of apparatus 300 may include a switch 324. Switch 324 may be implemented in any suitable manner, such as by a parallel set of transistors, switch fabric or switch matrix, or multiplexers. Switch 324 may receive a determination from comparator 316 that N time measurements have been received. Switch 324 may isolate the output of accumulators 318, 320 until N time measurements have been received. When N time measurements have been received, switch 324 may connect the output of accumulators 318, 320 to estimation circuit 304. The output of accumulators 318, 320 may manifest first sampled window 308 and second sampled window 310, respectively.

First sampled window 308 and second sampled window 310 may each be multiplied by a respective least squares factor according to equation 3. For example, first sampled window 308 may be multiplied by 12 by multiplier 12. Second sampled window 310 may be multiplied by a factor of 6 (N−1) by multiplier 328. This multiplication may be done during or after the generation of first sampled window 308 and second sampled window 310. Thus, estimation circuit 304 may receive a scaled version of first sampled window 308 and a scaled version of second sampled window 310. The results may be provided to adder 330, in the which the output of multiplier 326 is provided to a positive input of adder 330 and the output of multiplier 328 is provided to a negative input of adder 330, and adder 330 may produce the difference. Thus, estimation circuit 304 may add scaled versions of sampled windows 308, 310 to yield a sum or difference. The result output of adder 330 may be provided to multiplier 332, which may apply N to the output of adder 330 to estimate the frequency or period of clock signal 312. For example, multiplier 332 may multiply the output of adder 330 by a factor 1/(N(N^2−1)). The result may be the estimated period of clock signal 312, and the inverse of which may be the estimated frequency of clock signal 312.

The estimation error for the least square method of FIGS. 2-3 may be given as $$\epsilon^2 = \frac{12\sigma^2}{N(N^2-1)} \qquad \text{equation 4}$$

where each rising edge of the clock signal is assumed to have independent measurement noise with variance of $\sigma^2$. The estimation error thus decreases with increasing measurement window T (and increase of N) and the error reduction is proportional to $1/N^3$, faster than the method of equation 1 (that is, $1/N^2$). Thus, techniques and apparatuses of FIGS. 2-3 may represent a more accurate manner of estimating the frequency or period of a clock signal.

As shown and discussed above, apparatus 300 may include multiplication by multiplier 314 of each received time measurement $t_k$ before accumulating the resulting product. This amount of multiplication, wherein each time measurement $t_k$ is to be multiplied by a factor k before being accumulated, may cause an increase in the computational complexity of estimating the period or frequency of clock signal 312.

Figure 4:
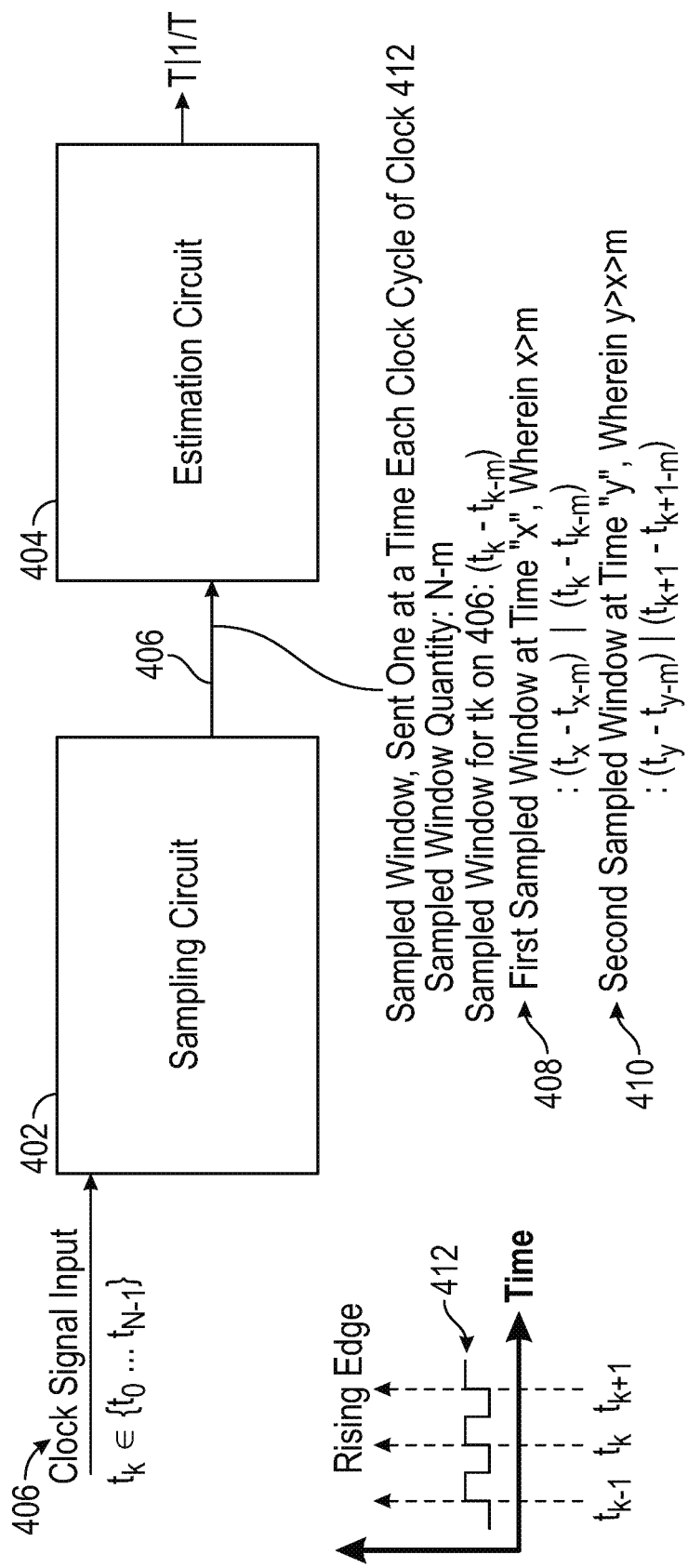
FIG. 4 illustrates an apparatus for estimating a clock period or frequency using comparisons of time measurements with previously made time measurements, according to examples of the present disclosure.

FIG. 4 illustrates an apparatus 400 for estimating a clock period or frequency using comparisons of time measurements with previously made time measurements, according to examples of the present disclosure. In comparison to the apparatuses of FIGS. 2-3, apparatus 400 may provide more efficient estimation by reducing a need to multiply each incoming time measurement $t_k$ as it arrives before accumulating it as part of a least squares estimation.

The estimation of the period or frequency of the clock signal of apparatus 400 may be given as $$\hat{T} = \frac{1}{N-m} \sum_{k=m}^{N-1} \frac{1}{m}(t_k - t_{k-m}) \qquad \text{equation 5}$$

where m is a delay for a given time measurement.

Apparatus 400 may be implemented in any suitable manner and within any suitable larger components or contexts. For example, apparatus 400 may be implemented within a microchip, microcontroller, clock regulation circuit, a system on a chip, or within any other suitable mechanism. Apparatus 400 may be implemented in a same or different mechanism as apparatuses 200, 300. Apparatus 400 may receive a clock signal input 406, which may be an example of clock signal inputs 206 or 306. Time measurements may be received. To estimate the frequency or period of a clock signal 412, N time measurements may be received on clock signal input 406. The N time measurements may be received one at a time as they are measured from clock signal 412. Each time measurement, denoted by $t_k$, may arise from a respective time of a respective portion of a given clock cycle of clock signal 412 to be measured. For example, each $t_k$ may be generated upon a rising edge of clock signal 412. Each $t_k$ may thus arrive at apparatus 400 upon a rising edge of clock signal 412. Each $t_k$ may arrive on clock signal input 406 in a serial or sequential manner, after the rising edge of clock signal 412.

Apparatus 400 may include a sampling circuit 402 and an estimation circuit 404 to generate an estimated frequency or period of clock signal 412 based upon the time measurements received on clock signal input 406. Sampling circuit 402 and estimation circuit 404 may be implemented in any suitable manner, such as by analog circuitry, digital circuitry, programmable logic, instructions for execution by a processor, an application specific integrated circuit, a field programmable gate array, or any suitable combination thereof. Although the present disclosure describes certain components and functions of sampling circuit 402 and estimation circuit 404, respectively, variations may be implemented where some components or functions of sampling circuit 402 or estimation circuit 404 may be included in or performed by the other of sampling circuit 402 and estimation circuit 404.

The received $t_k$ may be received by sampling circuit 402, which may sample time measurement $t_k$. In various examples, sampling circuit 402 may selectively sample time measurement $t_k$, wherein certain samples may be skipped, as discussed further below. For each received time measurement $t_k$ above a delay value m, sampling circuit 402 may output a sampled window to estimation circuit 404. Such a set of sampled windows may include at least a first sampled window 408 and a second sampled window 410. Each sampled window may be given as the difference between the time measurements $t_k$ and $t_{k-m}$, where again, m is a delay to reference a prior time measurement. The quantity of sampled windows may thus be a quantity of up to (N−m). Sampled windows may be sent one at a time each clock cycle of clock signal 412. In some examples, sampled windows may be sent only after k reaches m. In other examples, sampled windows may be sent before k reaches m, but such sampled windows might be discarded.

Thus, upon receiving a first time measurement $t_k$ on clock signal input 406, sampling circuit 402 may generate first sampled window 408. First sampled window 408 may be based upon the first time measurement and a first previous time measurement. The previous time measurement may be delayed with respect to the first time measurement by m time measurements 406 or samples of clock signal input 406 or clock cycles of clock signal 412. The quantity m may thus also represent a count of delayed measurements m. For example, at a given time x, the given time measurement on 406 may be $t_x$, wherein x is greater than m, and first sampled window 408 may be $(t_x - t_{x-m})$. Expressed differently, first sampled window 408 may be $(t_k - t_{k-m})$.

Upon receiving a second time measurement subsequent to the first time measurement on clock signal input 406, sampling circuit 402 may generate second sampled window 410. Second sampled window 410 may be based upon the second time measurement and a second previous time measurement. The second previous time measurement may be delayed with respect to the second time measurement by the same number, m, which was used in generating the first sampled window. The quantity m may represent time measurements 406 or samples of clock signal input 406 or clock cycles of clock signal 412. For example, at a given time y, the given time measurement on 406 may be $t_y$, wherein y is greater than x, which is greater than m, and first sampled window 408 may be $(t_y - t_{y-m})$. Expressed differently, second sampled window 410 may be $(t_{k+1} - t_{k+1-m})$.

The process of receiving time measurements on clock signal input 406 and generating sampled windows may continue until (N−m) sampled windows are generated.

Sampled windows 408, 410 may correspond to the generation of components of equation 5. For example, each may represent the $(t_k - t_{k-m})$ that is to be summed in equation 5. The sampled windows 408, 410 may be scaled the factor 1/m, or such scaling may be performed by estimation circuit 404.

Estimation circuit 404 may estimate the frequency or period of clock signal 412 from sampled windows 408, 410, and upon any other suitable available sampled windows. Estimation circuit 404 may make such an estimate in any suitable manner, such as with, for example, equation 5. Estimation circuit 404 may thus produce a value T for the estimated frequency of clock signal 412, or a frequency, given by 1/T for the estimated frequency of clock signal 412.

Figure 5:
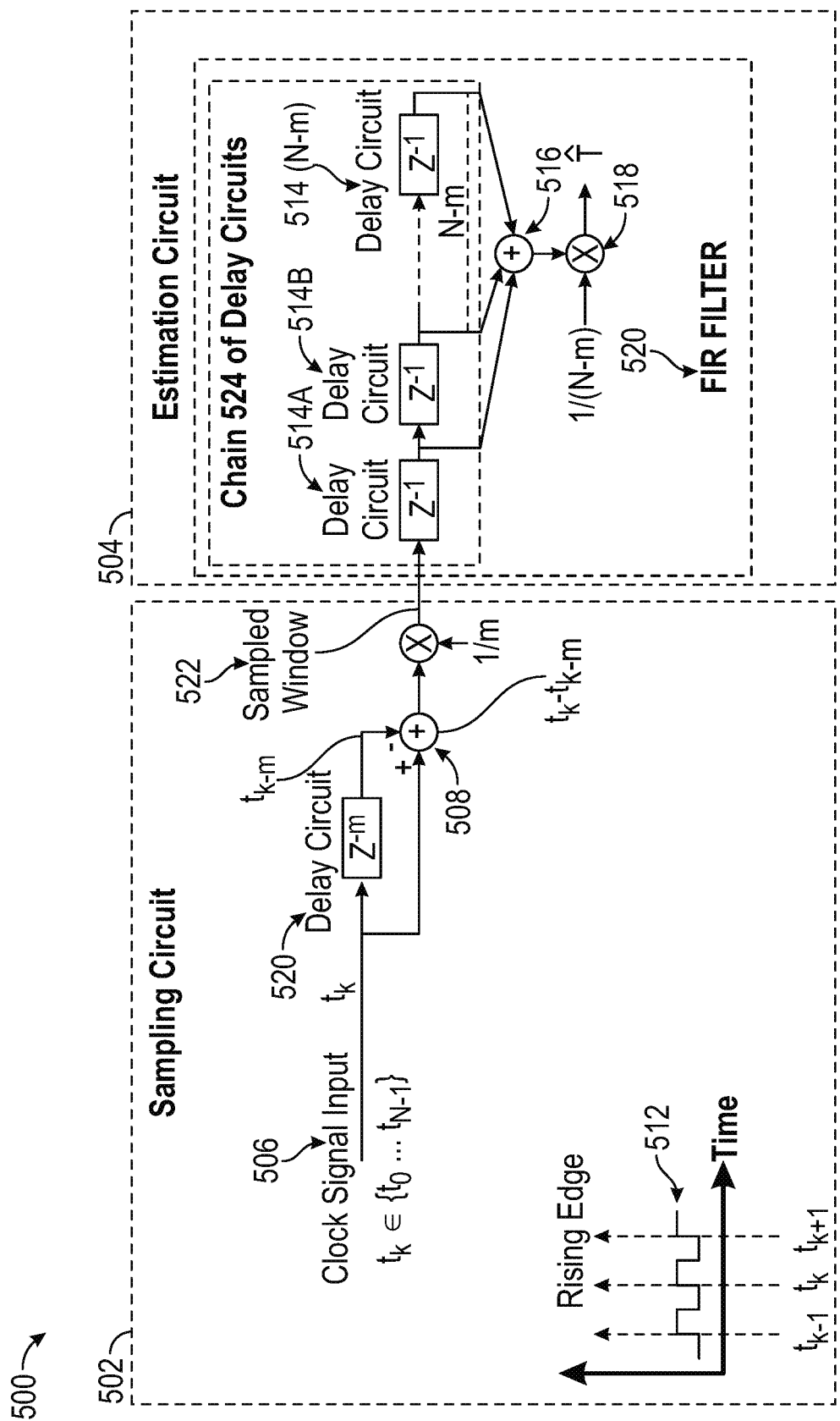
FIG. 5 is a more detailed illustration of an apparatus for estimating a clock cycle or period using comparisons of time measurements with previously made time measurements, according to examples of the present disclosure.

FIG. 5 is a more detailed illustration of an apparatus 500 for estimating a clock cycle or period using comparisons of time measurements with previously made time measurements, according to examples of the present disclosure. Apparatus 500 may be a more detailed implementation of apparatus 400. Apparatus 500 may include a clock signal input 506 corresponding to clock signal input 406, a sampling circuit 502 corresponding to sampling circuit 402, a sampled window 522 corresponding to first sampled window 408 and second sampled window 410, and may estimate a clock signal 512 corresponding to clock signal 412.

Apparatus 500 may include delay circuits 520, 514, delay circuits 514 formed as a chain 524 of delay circuits, adders 508, 516, and multipliers 510, 518. Moreover, all or a portion of estimation circuit 504 may make up a finite impulse response (FIR) filter 521. Each of these may be implemented in any suitable manner. Sampling circuit 502 may comprise delay circuit 520, adder 508 and multiplier 510. Estimation circuit 504 may comprise delay circuits 514, adder 516 and multiplier 518.

For example, delay circuits 520, 514 may be implemented as a register or other suitable memory location. Each of delay circuits 520, 514 may store a previously stored value for a designated number of cycles of clock signal 512 or samples thereof. For example, delay circuit 520 may be controlled by a designation of "-m" to store a value that was input m cycles previously. Thus, delay circuit 520, at a given cycle k of clock signal 512, may output the value it was loaded with at the cycle (k-m). Delay circuits 514 may be implemented with a designation of "-1" such that each returns, at a given cycle k of clock signal 512, the value that was input at cycle (k-1).

In sampling circuit 502, time measurements $t_k$ on clock signal input 506 may be loaded into delay circuit 520 at a given cycle k. Delay circuit 520 may yield the value with which it was loaded in the mth previous cycle, given as $t_{k-m}$. The value $t_{k-m}$ may be a first previous time measurement for a first time measurement $t_k$. The value $t_{k-m+1}$ may be a second previous time measurement for a second time measurement $t_{k+1}$.

Upon receiving time measurements $t_k$, time measurements $t_k$ may be stored in delay circuit 520 and delay circuit 520 may return the previous time measurement of $t_{k-m}$. Adder 508, which may receive time measurement $t_k$ on its positive input and the output of delay circuit 520 on its negative input, may subtract $t_{k-m}$ from $t_k$. The result may be divided by m by multiplier 510, i.e. the result is multiplied by a factor 1/m. The result may be a sampled window 522, such as first sampled window 408.

Upon receiving $t_{k+1}$, $t_{k+1}$ may be stored in delay circuit 520 and delay circuit 520 may return the previous time measurement of $t_{k+1-m}$. Adder 508 may subtract $t_{k+1-m}$ from $t_{k+1}$. The result may be divided by m by multiplier 510. The result may be a sampled window 522, such as second sampled window 410.

The results of sampling circuit 502 may be produced as sampled windows. As a given result of sampling circuit 502 is produced, it may be stored in a memory location such as a delay circuit of chain 524. In one example, as a given result of sampling circuit 502 is produced, it may be stored in a first or head delay circuit 514A of chain 524 of delay circuits of estimation circuit 504. At each cycle of clock signal 512, upon receiving a given sampled time measurement on clock signal input 506, delay circuits 514 may propagate its value to a subsequent delay circuit or next delay circuit 514 in chain 524. First or head delay circuit 514A may receive its value as a sampled window 522 from sampling circuit 502. The remainder of chain 524 may receive its value from the next highest delay circuit 514 in chain 524. Thus, sampling circuit 502 is to store the first sampled window from $(t_k - t_{k-m})$ in delay circuit 514A upon receiving a first time measurement $t_k$ on clock signal input 506. Upon receiving a second time measurement $t_{k+1}$, delay circuit 514A is to propagate the first sampled window to a next delay circuit 514B, and sampling circuit 502 is to store the second sampled window from $(t_{k+1} - t_{k+1-m})$ in delay circuit 514A.

The process of sampling time measurements by sampling circuit 502 from clock signal input 506 may continue until N time measurements have been sampled. This may result in the generation and storage of a quantity (N-m) sampled windows in chain 524.

As discussed above, estimation circuit 504 may include or be implemented as FIR filter 521, which may estimate, from at least the first and second sampled windows, the frequency or period of clock signal 512. FIR filter 521 may include a quantity of (N-m) taps, which may be manifested by inputs to adder 516 from the (N-m) delay circuits 514 of chain 524. Adder 516 may add the values stored in the (N-m) delay circuits 514 of chain 524, and multiplier 518 may divide the result by (N-m), i.e. multiply the result of adder 516 by a factor 1/(N-m).

Generally speaking, sampling circuit 502 thus generates a given sampled window 522 upon receiving a given time measurement $t_k$ on clock signal input 506. Such generation may include first sampled window 408 and second sampled window 410 of FIG. 4. Sampling circuit 502 may store sampled window 522 in delay circuit 514A of chain 524 of delay circuits. Sampling circuit 502 may perform such generation for at least a quantity (N-m) successive time measurements.

Delay circuit 514A may propagate an immediately previously generated sampled window to a next successive delay circuit 514B in chain 524 of delay circuits upon reception of a given time measurement $t_k$ on clock signal input 506. The other delay circuits 514 in chain 524 may also propagate their immediately previously stored sampled window to a next successive delay circuit 514 in chain 524.

After reception of N successive time measurements ($t_0$ . . . $t_{N-1}$) on clock signal input 506, estimation circuit may use (N-m) sampled windows as stored in (N-m) delay circuits 514 in chain 524 to estimate the frequency or period of clock signal 512.

Figure 6:
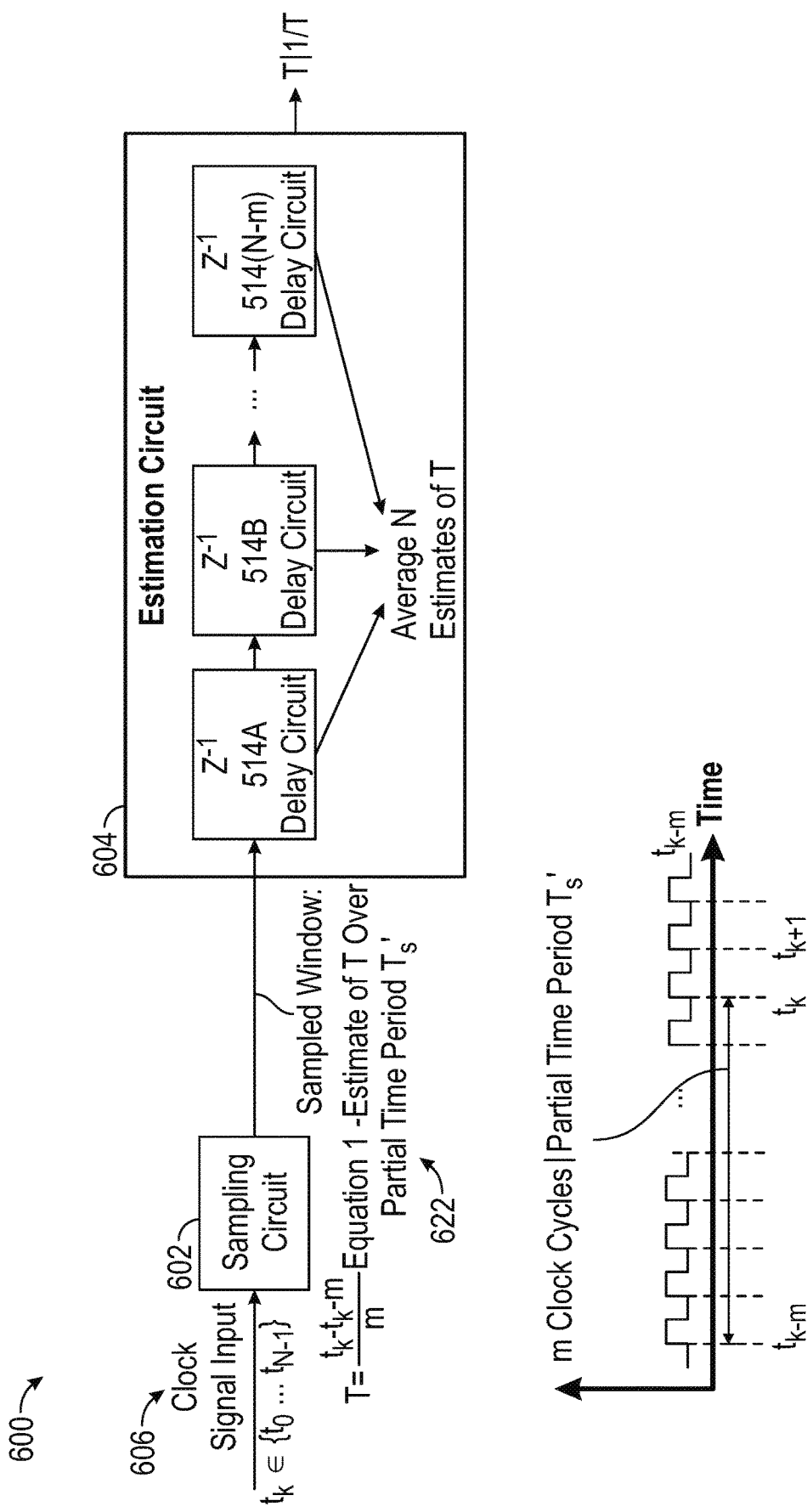
FIG. 6 is another illustration of operation of an apparatus using comparisons of time measurements with previously made time measurements, according to examples of the present disclosure.

FIG. 6 is another illustration of operation of apparatus 500 using comparisons of time measurements with previously made time measurements, according to examples of the present disclosure.

The operation of sampling circuit 502 to generate a given sampled window 522 may also produce an estimation of the period or frequency for a portion of the sample time Ts for the N time measurements. The portion of the sample time Ts for the N time measurements may be denoted as Ts', and may be referred to as a partial time period. The partial time period Ts' may include the time between a given time measurement $t_k$ and a delayed time measurement $t_{k-m}$ delayed by m measurements with respect to the given time measurement $t_k$. Sampling circuit 502, by subtracting the delayed time measurement $t_{k-m}$ from the given time measurement $t_k$, and dividing it by m, may be an estimate of the clock period of clock signal 512 over the partial time period Ts'. This estimate may be performed according to equation 1. Thus, a given sampled window 522 may be an estimate of the clock period of clock signal 512 over the given partial time period, which is the time between the given time measurement and the delayed time measurement.

As discussed above, sampling circuit 502 may store sampled window 522 in chain 524 of delay circuits 514.

Moreover, estimation circuit 504 may, upon reception of a quantity N successive time measurements at clock signal input 506, average the quantity (N-m) stored estimations of the frequency or period of clock signal 512 for the given partial time periods, as stored in delay circuits 514.

Figure 7:
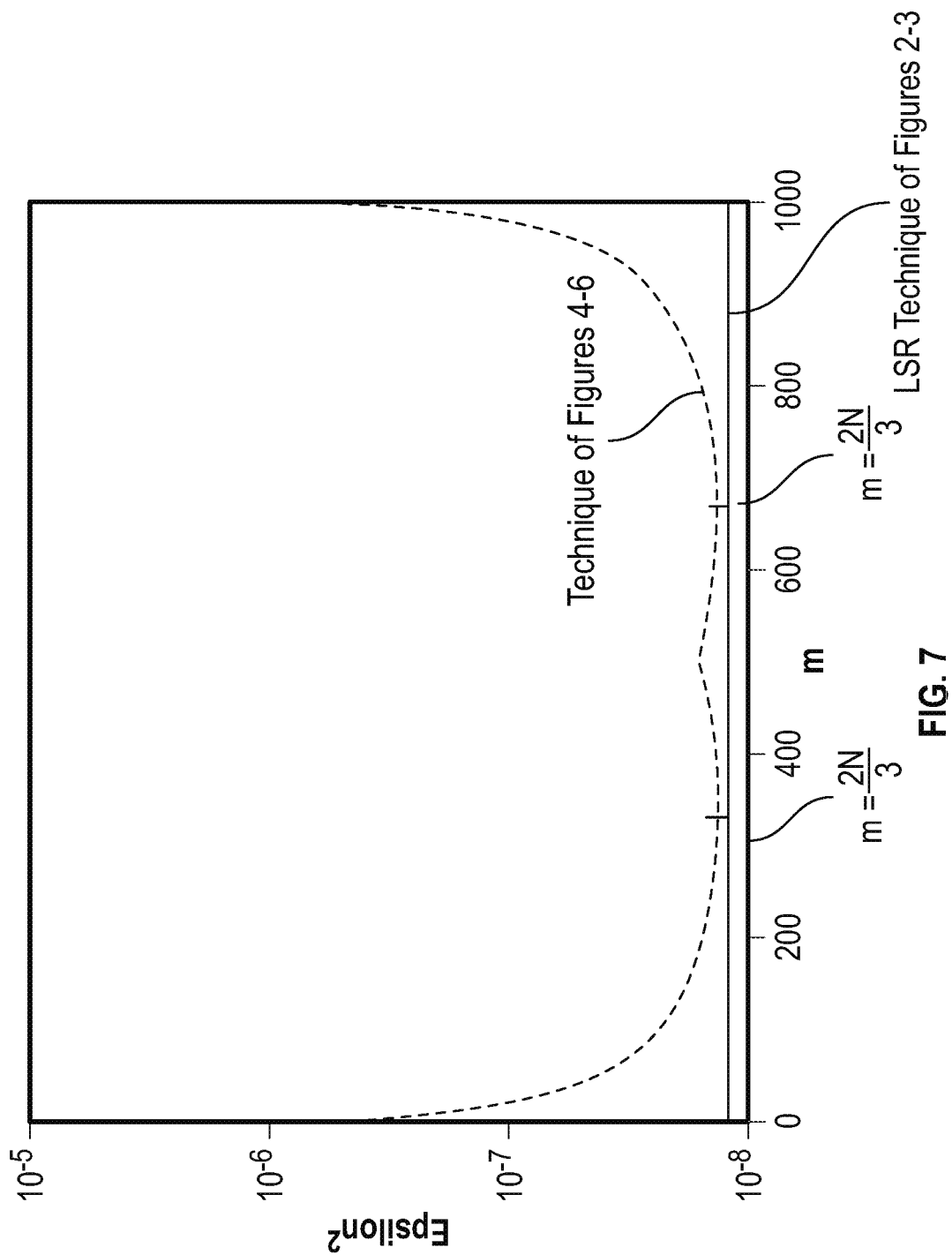
FIG. 7 is an illustration of simulation of error response for various values of delay m, according to examples of the present disclosure.

FIG. 7 is an illustration of simulation of error response for various values of delay m, according to examples of the present disclosure.

With regards to FIGS. 4-6, the selection of a value for m may affect the estimation error.

The estimation error when m is greater than or equal to N/2 may be given as $$\epsilon^2 = \frac{2\sigma^2}{m^2(N-m)} \qquad \text{equation 6}$$

For m less than N/2, there may be overlap between $t_k+m$ and $t_k$, which will cancel each other for k=m to k=N−m−1. Hence, the estimation error may be given as $$\epsilon^2 = \frac{2\sigma^2}{m(N-m)^2} \qquad \text{equation 7}$$

Equations 6 and 7 may be obtained from static analysis of error distribution with an assumption of independent and identical distributed observation noise.

Thus, as shown in FIG. 7, it can be observed that the estimation error does not just depend on the number of collected clock rising edges (N) but also the choice of m. FIG. 7 shows the relationship between clock period estimation error and values of m when N=1000. The estimation error for the least squares technique of FIGS. 2-3 is also shown for comparison. It can be seen from FIG. 7 that the performance of the apparatuses of FIGS. 4-6 can be very close to that of the least square's method of FIGS. 2-3 with a correct choice of m.

To get an improved value of m, the differential of $\epsilon^2$ can be taken with respect to m and then set it to 0:

$$\frac{\partial}{\partial m}\epsilon^2 = 0.$$

As a result, for m≥N/2, a good value for m may be m=2N/3 and the estimation error may be $$\epsilon^2 = \frac{27\sigma^2}{2N^3} \qquad \text{equation 8}$$

For m<N/2, the good value for m may be m=N/3 and the estimation error may be $$\epsilon^2 = \frac{27\sigma^2}{2N^3} \qquad \text{equation 9}$$

For both scenarios, the estimation error may be the same and may be proportional to $1/N^3$.

Figure 8:
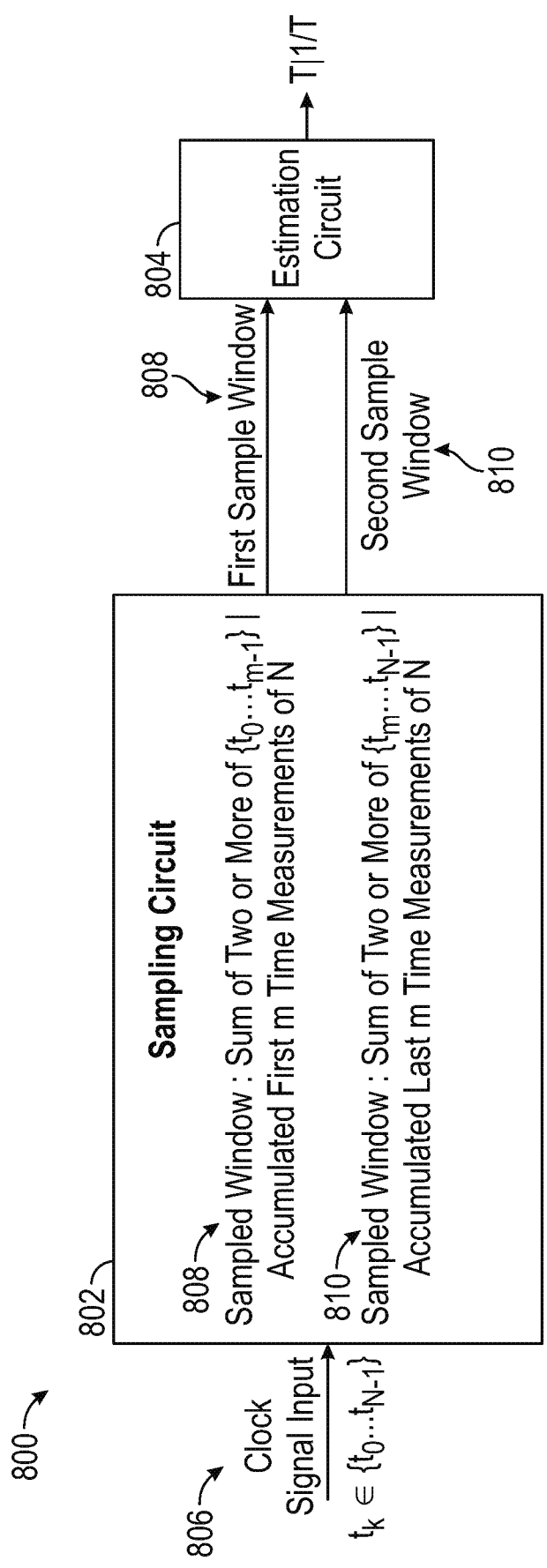
FIG. 8 is an illustration of an apparatus for estimating a clock period or frequency by evaluating the first m samples and last m samples of a set of N time measurements, according to examples of the present disclosure.
Figure 8:
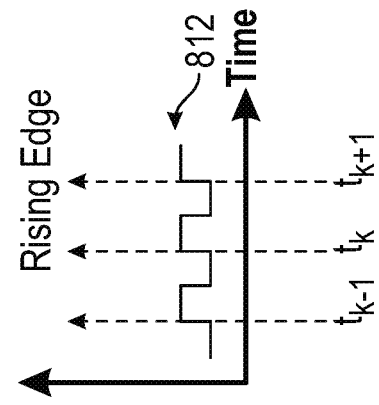

FIG. 8 is an illustration of an apparatus 800 for estimating a clock period or frequency by evaluating the first m samples and last m samples of a set of N time measurements, according to examples of the present disclosure. In comparison to the apparatuses of FIGS. 4-7, apparatus 400 may provide more efficient estimation by reducing a need to include a quantity of (N−m) taps for the FIR filter and estimation circuit therein.

The estimation of the period or frequency of the clock signal of apparatus 800 may begin with a restatement again of equation 5, and rewriting it as follows to yield equation 10:

$$\hat{T} = \frac{1}{N-m}\sum_{k=m}^{N-1}\frac{1}{m}(t_k - t_{k-m}) \qquad \text{equation 5}$$

rewritten as $$\hat{T} = \frac{1}{m(N-m)}\left(\sum_{k=m}^{N-1}t_k - \sum_{k=m}^{N-1}t_{k-m}\right)$$

rewritten as $$\hat{T} = \frac{1}{m(N-m)}\left(\sum_{k=m}^{N-1}t_k - \sum_{k=0}^{N-m-1}t_k\right) \qquad \text{equation 10}$$

where m is a change in sample size.

Apparatus 800 may be implemented with two accumulation processes, each with different start and end points. But the two accumulation processes share the same elements from {m ... N−m−1} if m<(N−1)/2, and these same elements are cancelled out after subtraction. Thus, equation 10 can be further written as $$\hat{T} = \frac{1}{m(N-m)}\left(\sum_{k=N-m}^{N-1}t_k - \sum_{k=0}^{m-1}t_k\right) \qquad \text{equation 11}$$

Thus, two accumulation processes are still used. The estimation of the frequency or period of clock signal 812 may be proportional to the difference between the sum of the last m time measurements and the sum of first m time measurements.

Apparatus 800 may include an architecture to perform these processes. In various further examples, shown further below, the two accumulation processes might be performed with one or two accumulators.

Apparatus 800 may be implemented in any suitable manner and within any suitable larger components or contexts. For example, apparatus 800 may be implemented within a microchip, microcontroller, clock regulation circuit, a system on a chip, or within any other suitable mechanism. Apparatus 800 may be implemented in a same or different mechanism as apparatuses 200, 300, 400, 500. Apparatus 800 may receive a clock signal input 806, which may be an example of clock signal inputs 206, 306, 406, 506. Time measurements $t_k$ may be received. To estimate the frequency or period of a clock signal 812, N time measurements $t_k$ may be received on clock signal input 806. The N time measurements $t_k$ may be received one at a time as they are measured from clock signal 812. Each time measurement, denoted by $t_k$, may arise from a respective time of a respective portion of a given clock cycle of clock signal 812 to be measured. For example, each $t_k$ may be generated upon a rising edge of clock signal 812. Each $t_k$ may thus arrive at apparatus 800 upon a rising edge of clock signal 812. Each $t_k$ may arrive on clock signal input 806 in a serial or sequential manner, after the rising edge of clock signal 812.

Apparatus 800 may include a sampling circuit 802 and an estimation circuit 804 to generate an estimated frequency or period of clock signal 812 based upon the time measurements received on clock signal input 806. Sampling circuit 802 and estimation circuit 804 may be implemented in any suitable manner, such as by analog circuitry, digital circuitry, programmable logic, instructions for execution by a processor, an application specific integrated circuit, a field programmable gate array, or any suitable combination thereof. Although the present disclosure describes certain components and functions of sampling circuit 802 and estimation circuit 804, respectively, variations may be implemented where some components or functions of sampling circuit 802 or estimation circuit 804 may be included in or performed by the other of sampling circuit 802 and estimation circuit 804.

The received time measurement $t_k$ may be received by sampling circuit 802, which may sample $t_k$. In various examples, sampling circuit 802 may selectively sample $t_k$, wherein certain samples may be skipped, as discussed further below.

Sampling circuit 802 may generate a first sampled window 808. First sampled window 808 may include a sum of two or more of the first m elements of the N time measurements received on clock signal input 806. In one example, all of the first m elements of the N time measurements received on clock signal 806 may be summed and included in first sampled window 808. In another example, some of these time measurements may be skipped. The set of the first m time measurements of the N time measurements that are summed may be denoted $t_0 \ldots t_{m-1}$, and the sum represented in first sampled window 808 may be denoted as $\Sigma_{k=0}^{m-1} t_k$. This may be the accumulated first m time measurements of the N time measurements that arrive on clock signal input 806.

Sampling circuit 802 may generate a second sampled window 810. Second sampled window 810 may include a sum of two or more of the last m of the N time measurements received on clock signal input 806. In one example, all of the elements of the last m of the N time measurements $t_k$ received on clock signal 806 may be summed and included in second sampled window 810. In another example, some of these time measurements may be skipped. The set of the last m elements of the time measurements of the N time measurements may be denoted $t_{N-m} \ldots t_{N-1}$. The quantity of these time measurements may be m. The sum represented in second sampled window 810 may be denoted as $\Sigma_{k=N-m}^{N-1} t_k$. This may be the accumulated last m time measurements of the N time measurements that arrive on clock signal input 806.

Estimation circuit 804 may estimate the frequency or period of clock signal 812 based upon first sampled window 808 and second sampled window 810. Estimation circuit 804 may make such an estimation using, for example, equation 11. Estimation circuit 804 may subtract sampled window 808 from sampled window 810, and apply a factor of $1/(m(N-m))$ to the result to obtain the estimation of the frequency or period of clock signal 812.

Figure 9:
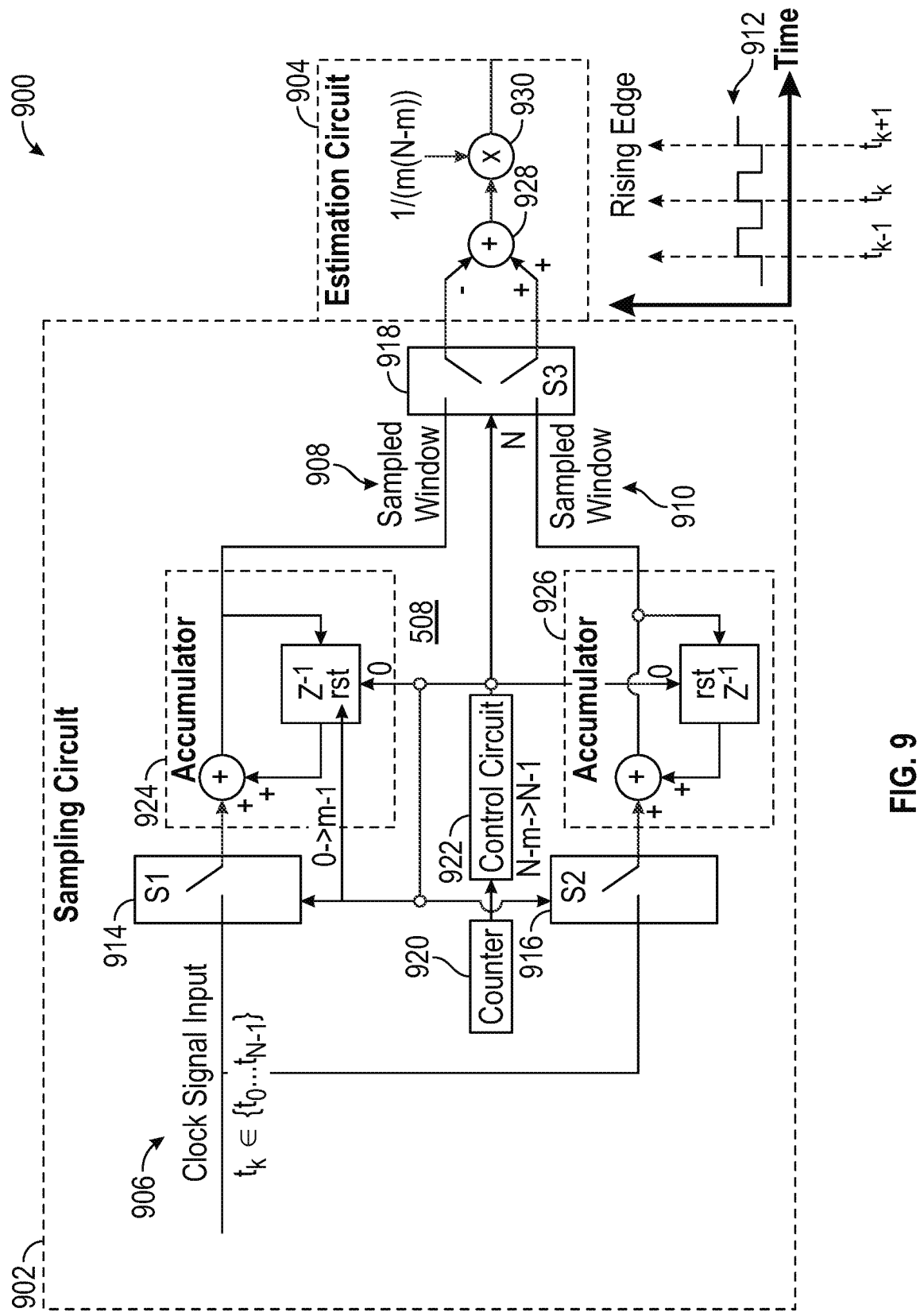
FIG. 9 is a more detailed illustration of an apparatus for estimating a clock cycle or period by evaluating the first m samples and last m samples of a set of N time measurements using two accumulators, according to examples of the present disclosure.

FIG. 9 is a more detailed illustration of an apparatus 900 for estimating a clock cycle or period by evaluating the first m samples and last m samples of a set of N time measurements using two accumulators, according to examples of the present disclosure. Apparatus 900 may be a more detailed implementation of apparatus 800. Apparatus 900 may include a clock signal input 906 corresponding to clock signal input 806, a sampling circuit 902 corresponding to sampling circuit 802, a first sampled window 908 corresponding to first sampled window 808, a second sampled window 910 corresponding to second sampled window 810, and may estimate a clock signal 912 corresponding to clock signal 812.

Apparatus 900 may include switches 914, 916, 918, a first accumulator 924, a second accumulator 926, counter 920, control circuit 922, adder 928, and multiplier 930. Each of these may be implemented in any suitable manner. Sampling circuit 902 comprises switches 914, 916, 918, first accumulator 924, second accumulator 926, counter 920 and control circuit 922. Estimation circuit 904 comprises adder 928 and multiplier 930.

Switches 914, 916, 918 may be implemented in any suitable manner, such as by a parallel set of transistors, switch fabric or switch matrix, or multiplexers.

Accumulators 924, 926 may be implemented in any suitable manner, such as by analog circuitry, digital circuitry, programmable logic, instructions for execution by a processor, an application specific integrated circuit, a field programmable gate array, or any suitable combination thereof. Specifically, accumulators 924, 926 may be implemented by an adder accepting one input to be accumulated, and one input from a delay circuit (denoted as the block labeled $Z^{\wedge}-1$) routed in feedback from the output of the adder. The delay circuit may include a register or other storage for holding the running total of previous accumulated inputs.

Counter 920 may be implemented in any suitable manner, such as a count-up counter, count-down counter, or timer. Counter 920 may count a quantity of time measurements $t_k$ that have arrived on clock signal input 906 to make a given estimation of frequency or period of clock signal 912. Counter 920 may thus increment an index k of the quantity of the N time measurements. Each clock cycle of clock signal 912, counter 920 may increment k as the index of received time measurements. Counter 920 may count the cycles of clock signal 912. The output of counter 920 may be controlled so as to be an integer value between zero and N−1, wherein N is the total number of input clock cycles for which the frequency or period of clock signal 312 is to be estimated.

Control circuit 922 may orchestrate or control various aspects of apparatus 900 to provide the correct order of operations of the components so as to estimate the frequency or period of clock signal 912. Control circuit 922 may be implemented in any suitable manner, such as by analog circuitry, digital circuitry, programmable logic, instructions for execution by a processor, an application specific integrated circuit, a field programmable gate array, or any suitable combination thereof.

Control circuit 922 may reset counter 920 and accumulators 924, 926 upon starting a new determination of a frequency or period of clock signal 912.

Time measurements may arrive on clock signal input 906, denoted as $t_k$.

For the first m time measurements of the N time measurements that will arrive for the estimation of a frequency or period of clock signal 912, as indicated by counter 920, control circuit 922 may close switch 914 to allow time measurements to be applied to an input of first accumulator 924 so as to accumulate these first m values. These values accumulated in accumulator 924 may be a running total of the first m received time measurements to be produced as first sampled window 908. Initially, control circuit 922 may open switch 916 so as to prevent time measurements to be applied to an input of second accumulator 926 until the last m values in the N time measurements arrive. Also, switch 918 may be opened by control circuit 922 so as to prevent output of first and second accumulators 924, 926 from being provided as sampled windows 908, 910 to estimation circuit 904. When m time measurements have been accumulated, control circuit 922 may open switch 914 to prevent further time measurements to be accumulated in first accumulator 924.

Thus, upon reception of a given time measurement $t_k$ on clock signal input 906, if less than m measurements have been received, first accumulator 924 will add the given time measurement to a first running total of time measurements, which may be eventually produced as sampled window 908. Upon reception of a given time measurement $t_k$ on clock signal input 906, if m or greater time measurements have been received, first accumulator 924 may maintain its first running total of time measurements. First accumulator 924 may thus add successive time measurements of the first m of the N time measurements to generate sample window 908.

For the last m of the N time measurements that will arrive for the estimation of a frequency or period of clock signal 912, as indicated by counter 920, control circuit 922 may close switch 916 so as to allow time measurements to be applied to an input of second accumulator 926 so as accumulate these last m of the N time measurements therein. These values accumulated in second accumulator 926 may be a running total of the last m received time measurements to be produced as second sampled window 910. Also, switch 918 may continue to be open so as to prevent output of first and second accumulators 924, 926 from being provided as sampled windows 908, 910 to estimation circuit 904. The operation of control circuit 922 to open or close switch 914 may be independent, as it may be performed according to whether the first m time measurements have arrived.

Thus, upon reception of a given time measurement $t_k$ on clock signal input 906, if (N−m) or greater time measurements and less than N time measurements have been received, second accumulator 926 may add the given time measurement to a second running total of time measurements to generate second sampled window 910.

Once N time measurements have been received, control circuit 922 may open switch 918 so as to allow the values accumulated in accumulators 924, 926 to be provided to estimation circuit 904. These values may be denoted as first sampled window 908 and second sampled window 910, respectively.

In estimation circuit 904, adder 928 may subtract first sampled window 908 from second sampled window 910. In particular, when switch 918 is closed, the output of first accumulator 924 is provided to the negative input of adder 928 and the output of second accumulator 926 is provided to the positive input of adder 928. The result may be divided by (m(N−m)) by multiplier 930, i.e. the output of adder 928 may be multiplied by a factor 1/(m(N−m) by multiplier 930, and the output given as the estimated period or frequency of clock signal 912. Upon the sampling circuit reception of N time measurements, estimation circuit 904 may thus apply first sampled window 908 and second sampled window 910 to adder 928, subtracting first sampled window 908 from second sampled window 910, and apply a result from adder 928 to a multiplication factor of 1/(m(N−m)) with multiplier 930 to yield an estimated a frequency or period of the clock signal.

Figure 10:
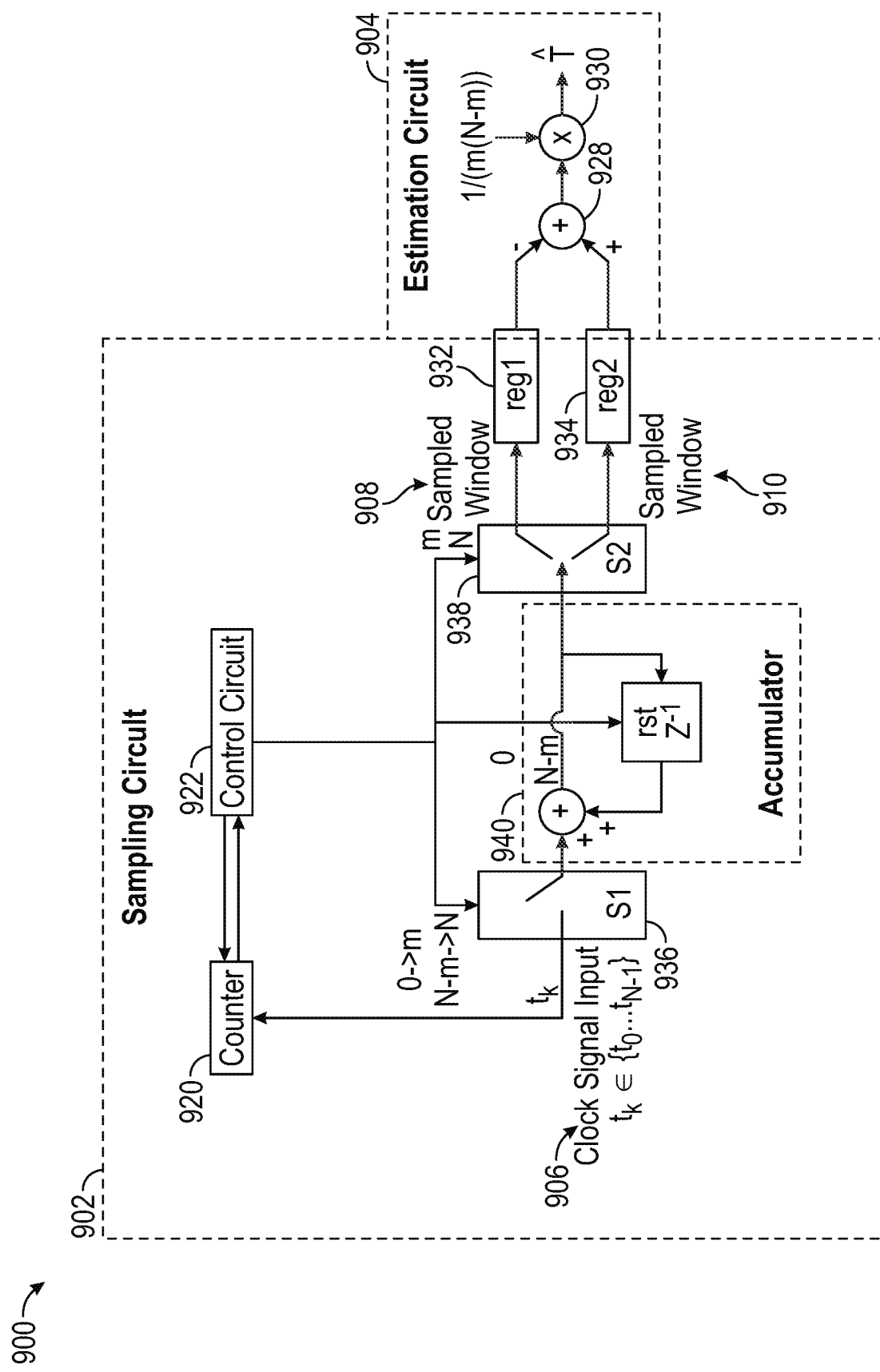
FIG. 10 is an illustration of another possible implementation of an apparatus for estimating a clock cycle or period by evaluating the first m samples and last m samples of a set of N time measurements using a single accumulator, according to examples of the present disclosure.

FIG. 10 is an illustration of another possible implementation of apparatus 900 for estimating a clock cycle or period by evaluating the first m samples and last m samples of a set of N time measurements using a single accumulator, according to examples of the present disclosure.

Apparatus 900 as shown in FIG. 10 may differ in comparison with FIG. 9 in terms of the number of accumulators used. In FIG. 9, if m is less than (N−1)/2, then switches 914, 916 might not be ON at the same time and thus not accumulate a given same time measurement $t_k$. Thus, a single accumulator might be used as shown in FIG. 10 when m is less than N/2.

Apparatus 900 may still include a counter 920, control circuit 922, adder 928, and multiplier 930.

Apparatus 900 may include switches 936, 938, which may be implemented in any suitable manner, such as by a parallel set of transistors, switch fabric or switch matrix, or multiplexers. Sampling circuit 902 may comprise switches 936, 938, accumulator 940, counter 920 and control circuit 922. Estimation circuit 904 may comprise adder 928 and multiplier 930. Register 932 and 934 may be shared between sampling circuit 902 and estimation circuit 904.

Apparatus 900 may include a single accumulator 940, which may be implemented in any suitable manner, such as by analog circuitry, digital circuitry, programmable logic, instructions for execution by a processor, an application specific integrated circuit, a field programmable gate array, or any suitable combination thereof. Specifically, accumulators 924, 926 may be implemented by an adder accepting one input to be accumulated, and one input from a delay circuit (denoted as the block labeled Z^−1) routed in feedback from the output of the adder. The delay circuit may include a register or other storage for holding the running total of previous accumulated inputs.

Apparatus 900 may include memory locations such as a first register 932 and a second register 934.

Control circuit 922 may reset accumulator 940 when the estimation of the period or frequency of clock signal 912 begins. Moreover, control circuit 922 may reset accumulator 940 when m time measurements have been made from clock signal input 906. Thus, control circuit 922 may reset accumulator 940 when counter 920 is at zero and at (N−m).

Accumulator 940 may selectively receive time measurements $t_k$ from clock signal input 906. The selective application of time measurements from clock signal input 906 may be made by operation of switch 936. Moreover, output values of accumulator 940 may be selectively applied to one of registers 932, 934 through operation of switch 938. Switches 936, 938 may be controlled by control circuit 922 based on the count of received time measurements as counted by counter 920.

When the estimation begins and the index produced by counter 920 is zero, switch 936 may be closed and time measurements $t_k$ from clock signal input 906 may be applied to the input of accumulator 940. Accumulator 940 may add received time measurements as a running total of a sum of the first m time measurements. This may continue until counter 920 reaches m−1. At that time, switch 936 may be opened by control circuit 922 and switch 938 may be caused to connect the output of accumulator 940 to first register 932 so that the value of accumulator 940 may be stored in first register 932. This may be first sampled window 908 produced by accumulator 940 and stored in first register 932, to be provided to estimation circuit 904.

Accordingly, upon reception of a given time measurement $t_k$ on clock signal input 906, if counter 920 indicates that less than m time measurements have been received, accumulator 940 may add the given time measurement to the first running total of time measurements accumulated therein to generate first sampled window 908. Upon reception of a given time measurement $t_k$ on clock signal input 906, if counter 920 indicates that m time measurements have been received, sampling circuit 902 is to store the first running total of time measurements as first sampled window 908 in a first memory such as first register 932 and to reset accumulator 940.

Subsequently, switch 936 may be open until the number of time measurements as counted by counter 920 reaches (N−m). Then, accumulator 940 may be reset by control circuit 922. Then, switch 936 may again be closed by control circuit 922 so as to again apply received time measurements $t_k$ on clock signal input 906 to accumulator 940, to accumulate the last m received time measurements of the N time measurements. Accumulator 940 may accumulate these values as a running total of the sum of the last m received time measurements, to be used to produce sampled window 910.

Accordingly, upon reception of a given time measurement $t_k$ on clock signal input 906, if counter 920 indicates that a quantity of time measurements greater than or equal to (N−m) but less than N has been received, accumulator 940 may add the given time measurement to the second running total of time measurements accumulated therein to generate second sampled window 910. Upon reception of a given time measurement $t_k$ on clock signal input 906, if counter 920 indicates that N time measurements have been received, sampling circuit 902 is to store the first running total of time measurements as second sampled window 910 in a second memory such as second register 934 and to reset accumulator 940, by closing the appropriate portion of switch 938, responsive to control circuit 922.

Figure 11:
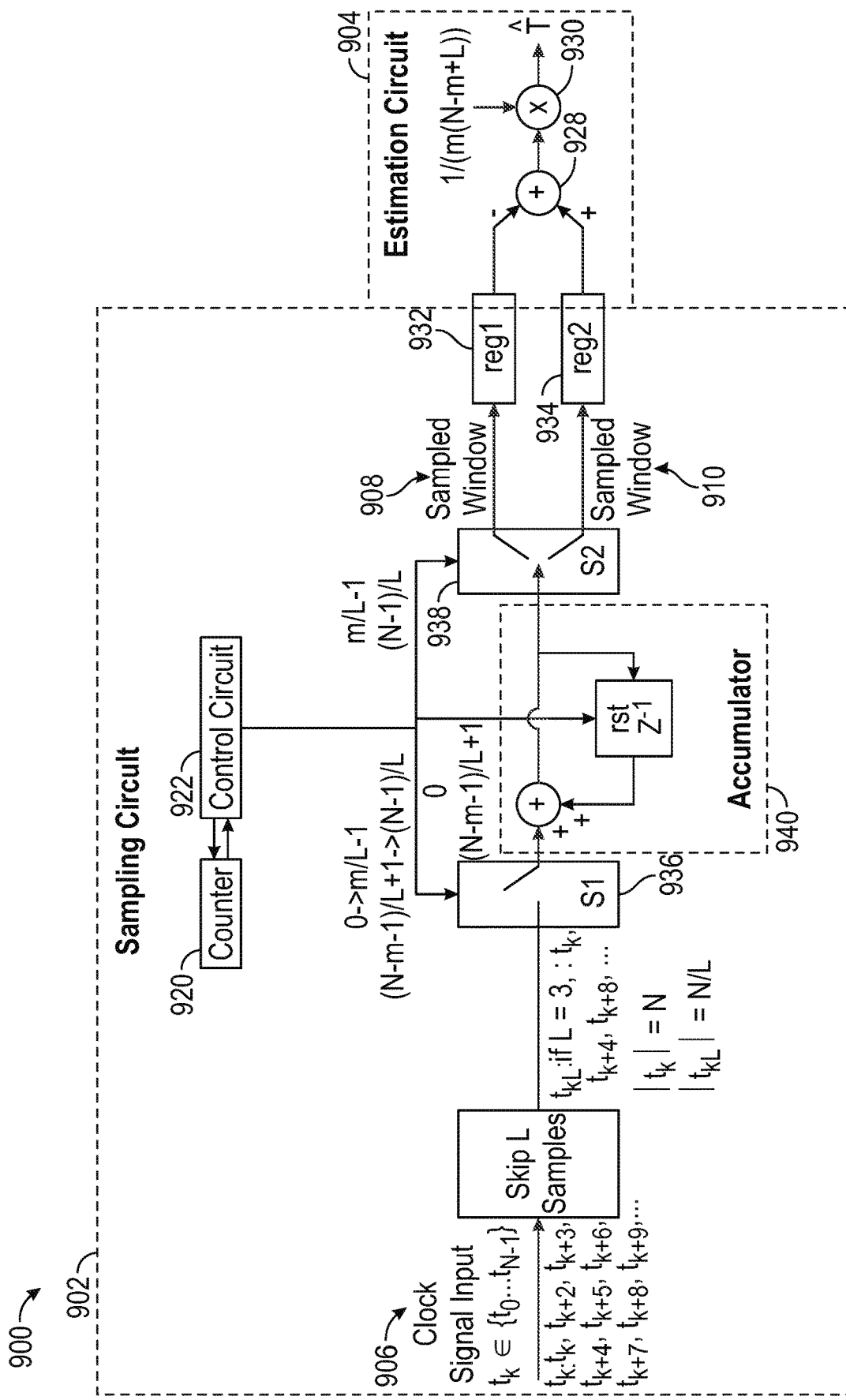
FIG. 11 is an illustration of yet another possible implementation of an apparatus for estimating a clock cycle or period by skipping L measurements after each sample, according to examples of the present disclosure.

Upon the sampling circuit reception of N time measurements, estimation circuit 904 may apply first sampled window 908 as stored in first register 932 and second sampled window 910 as stored in second register 934 to adder 928, subtracting first sampled window 908 from second sampled window 910, and apply a result from adder 928 to a multiplication factor of 1/(m(N−m)) with multiplier 930 to yield an estimated a frequency or period of the clock signal. In particular, the output of first register 932 is provided to the negative input of adder 928 and the output of second register 934 is provided to the positive input of adder 928. The result may be divided by (m(N−m)) by multiplier 930, i.e. the output of adder 928 may be multiplied by a factor 1/(m(N−m) by multiplier 930, FIG. 11 is an illustration of yet another possible implementation of apparatus 900 for estimating a clock cycle or period by skipping L measurements after each sample, according to examples of the present disclosure. FIG. 11 illustrates a possible implementation or variation of any of the apparatuses of FIGS. 8-10, wherein the sampling rate may be reduced by skipping the sampling of some of the received time measurements on clock signal input 906. The illustration in FIG. 11 is specifically made with reference to a variation of the illustration in FIG. 10, but may also be applicable to the illustrations of FIGS. 8-9.

In FIG. 11, a skip circuit 950 may be implemented in any suitable manner, such as by analog circuitry, digital circuitry, programmable logic, instructions for execution by a processor, an application specific integrated circuit, a field programmable gate array, or any suitable combination thereof. Skip circuit 950 may selectively skip any suitable number of samples incoming on clock signal input 906. A given time measurement $t_k$ may be followed by a designated number of skipped time measurements. The number of time measurements to omit or skip may be given as L, resulting in sampling of every (L+1)th time measurement. Thus, a given time measurement that is actually sampled for use in accumulation and estimation of frequency or period of clock signal 912 may be given as $t_{kL}$. If L was 3, for example, the actually sampled time measurements would be $t_k$, $t_{k+4}$, $t_{k+8}$, etc., in the form of $t_{k+i(L+1)}$.

The estimation of a period of clock signal 912 using this technique may be given as $$\hat{T} = \frac{1}{\frac{N-m}{L}+1} \sum_{k=\frac{m}{L}}^{\frac{N-1}{L}} \frac{1}{mL}(t_{kL} - t_{kL-m}) \quad \text{equation 12}$$

which may be further reduced as $$\hat{T} = \frac{1}{m(N-m+L)}\left(\sum_{k=\frac{N-m-1}{L}+1}^{\frac{N-1}{L}} t_{kL} - \sum_{k=0}^{\frac{m}{L}-1} t_{kL}\right) \quad \text{equation 13}$$

when m<N/2, and a single accumulator can be used such as the implementation in FIG. 10. By skipping a next L time measurements to sample, accumulator 940 may be operated at a lower clock rate.

In FIG. 10, sampling circuit 902 may thus use skip circuit 950 to skip L samples after a given received time measurement $t_k$ before sampling another received time measurement, and to exclude the skipped L samples from generation of first sampled window 908 and second sampled window 910. These skipped L samples may be excluded by being not sampled and not provided to accumulator 940 for accumulation in either the first or second running totals of the first or last m samples of the received time measurements.

The set of received time measurements $t_k$ may be of a size N, while the set of actually sampled received time measurements $t_{kL}$ may be of a size N/L. Thus, sampling circuit 902 may sample a quantity N/L of the received N time measurements.

Control circuit 922 may cause accumulator 940 to accumulate a first quantity of sampled time measurements $t_{kL}$, such as (m/L), and store these in a first memory such as first register 932 as first sampled window 908. Control circuit 922 may cause accumulator 940 to accumulate a last quantity (m/L) of sampled time measurements $t_{kL}$, and store these in a second memory such as second register 934 as second sampled window 910.

Moreover, counter 920 operation may be adjusted to account for the skipping of L samples by skip circuit 950. Thus, counter 920 may count a number of time measurements that are actually sampled—i.e., $t_{kL}$ time measurements, as opposed to $t_k$ time measurements. Moreover, this may cause the control of switches 936, 938 and accumulator 940 to factor in L, the number of samples skipped between $t_{kL}$ time measurements. Generally, the thresholds described in FIG. 10 may be augmented by dividing by L or L−1, as appropriate.

Upon sampling a given time measurement $t_{kL}$ from clock signal input 906 and forwarded by skip circuit 950, if counter 920 indicates that less than m/L time measurements have been sampled, sampling circuit 902 may cause control circuit 922 to cause accumulator 940 to add the sampled given time measurement $t_{kL}$ to a first running total of sampled time measurements to generate first sampled window 908.

Upon sampling a given time measurement $t_{kL}$ from clock signal input 906 and forwarded by skip circuit 950, if counter 920 indicates that more than m/L but less than (N-m)/L time measurements have been sampled, sampling circuit 902 may cause control circuit 922 to cause switch 938 to store the first running total of sampled time measurements as first sampled window 908 in a first memory such as first register 932 and to reset accumulator 940.

Upon sampling a given time measurement $t_{kL}$ from clock signal input 906 and forwarded by skip circuit 950, if counter 920 indicates that greater than (N−m)/L time measurements but less than (N−1)/L time measurements have been sampled, sampling circuit 902 may cause control circuit 922 to cause accumulator to add the sampled given time measurement to a second running total of sampled time measurements to generate second sampled window 910.

Upon sampling a given time measurement $t_{kL}$ from clock signal input 906 and forwarded by skip circuit 950, if counter 920 indicates that N/L or more time measurements have been sampled, sampling circuit 902 may cause control circuit 922 to cause switch 938 to store the second running total of sampled time measurements as second sampled window 910 in a second memory such as second register 934.

Upon sampling of N/L time measurements from clock signal input 906, estimation circuit 904 may be to apply first sampled window 908 and second sampled window 910 to adder 928 to subtract first sampled window 908 from second sampled window 910, and to apply a result from adder 928 to multiplier 930 with a multiplication factor of 1/(m(N−m+L)) to yield an estimated frequency or period of clock signal 912.

Figure 12:
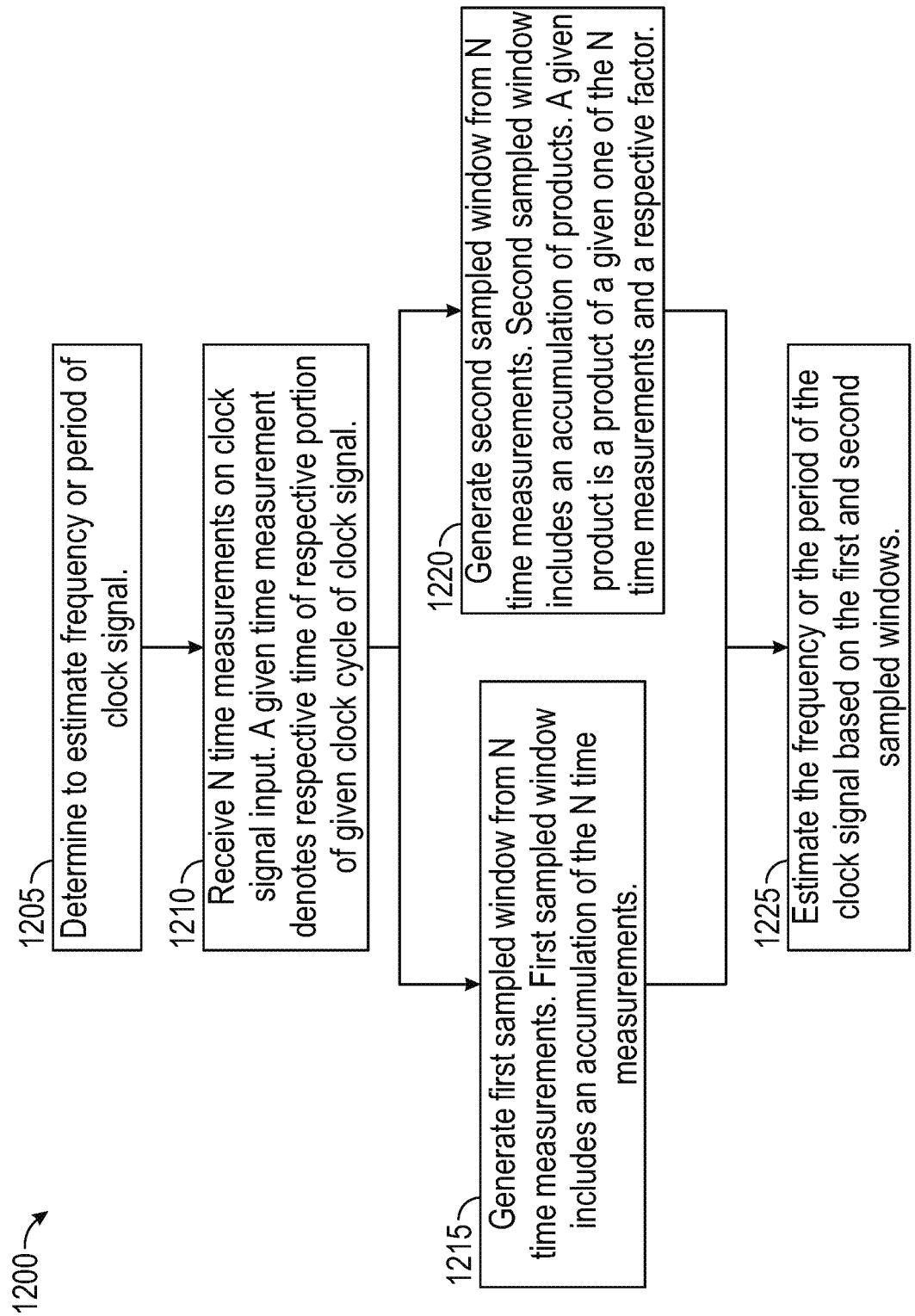
FIG. 12 is an illustration of a method for estimating a clock signal according to a least squares method, according to examples of the present disclosure.

FIG. 12 is an illustration of a method 1200 for estimating a clock signal according to a least squares method, according to examples of the present disclosure. Method 1200 may illustrate operation of or be implemented by any suitable apparatus, such as the elements of FIGS. 2-3. Method 1200 may begin or end at any suitable point. Method 1200 may include more or fewer steps than shown, and the steps of method 1200 may be optionally repeated, omitted, performed in a different order, performed recursively or in parallel with one another, or recursively or in parallel with another instance of method 1200.

At 1205, it may be determined to estimate the frequency or period of a clock signal.

At 1210, N time measurements may be received on a clock signal input. A given time measurement may denote a respective time of a respective portion, such as a rising edge, of a given clock cycle of the clock signal input.

1215 and 1220 may be performed in parallel.

At 1215, a first sampled window may be generated from N time measurements. The first sampled window may include an accumulation of the N time measurements.

At 1220, a second sampled window may be generated from N time measurements. The second sampled window may include an accumulation of products. A given product may be a product of a given one of the N time measurements and a respective factor. The respective factor may be an index of the given time measurement.

At 1225, the frequency or the period of the clock signal may be estimated based on the first and second sampled windows.

Figure 13:
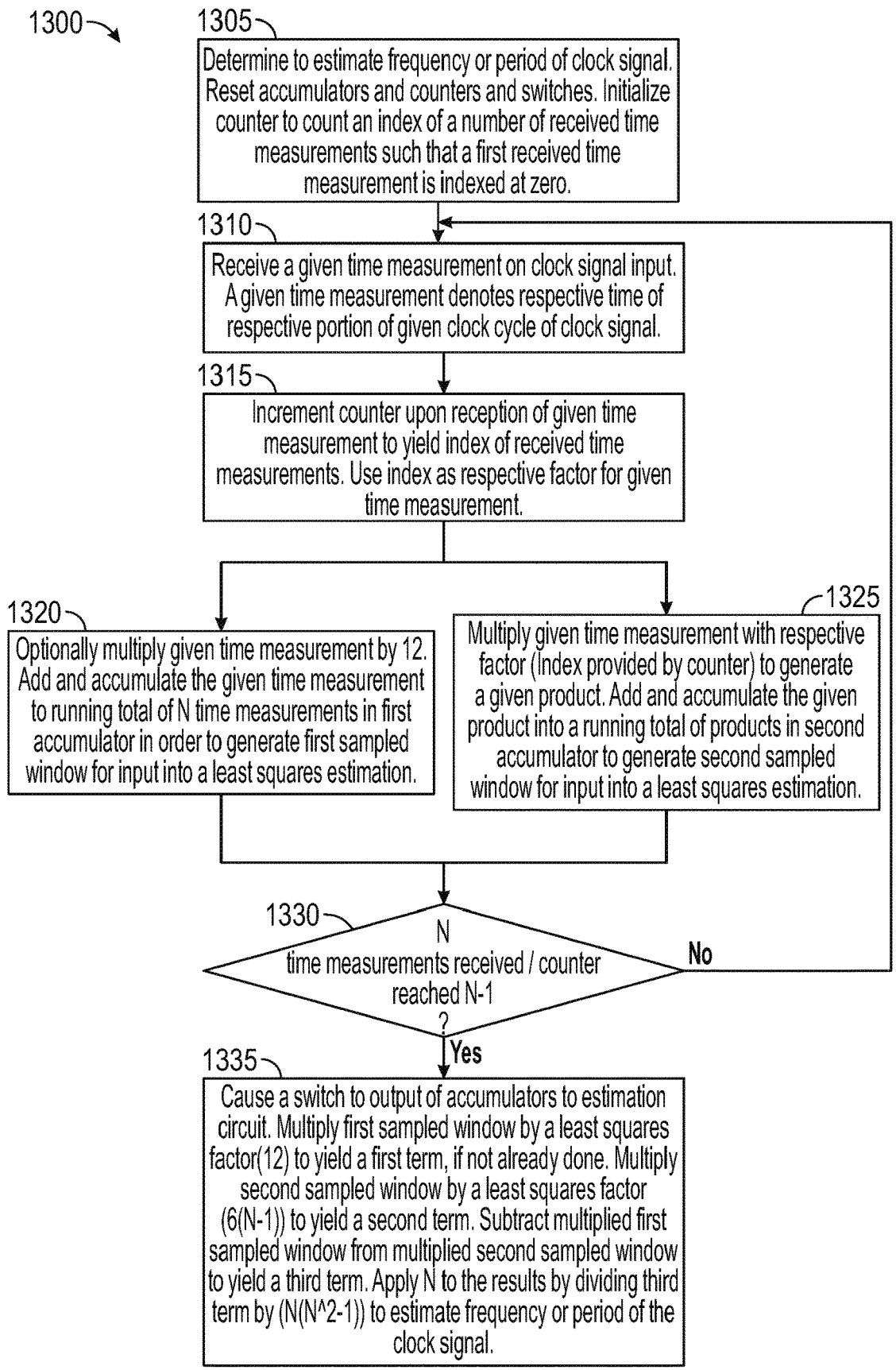
FIG. 13 is a more detailed illustration of a method for estimating a clock signal according to a least squares method, according to examples of the present disclosure.

FIG. 13 is an illustration of a more detailed method 1300 for estimating a clock signal according to a least squares method, according to examples of the present disclosure. Method 1300 may illustrate operation of or be implemented by any suitable apparatus, such as the elements of FIGS. 2-3. Method 1300 may be a more detailed illustration of the method of FIG. 12. Method 1300 may begin or end at any suitable point. Method 1300 may include more or fewer steps than shown, and the steps of method 1300 may be optionally repeated, omitted, performed in a different order, performed recursively or in parallel with one another, or recursively or in parallel with another instance of method 1300.

At 1305, it may be determined to estimate the frequency or period of a clock signal. Accumulators and counters and switches may be reset. The counter may be to count an index of a number of received time measurements such that a first received time measurement is indexed at zero.

At 1310, a give time measurement of N time measurements may be received on a clock signal input. A given time measurement may denote a respective time of a respective portion, such as a rising edge, of a given clock cycle of the clock signal input.

At 1315, the counter may be incremented upon reception of the given time measurement to yield an index of received time measurements. The index may be used as a respective factor for given time measurement.

1320 and 1325 may be performed in parallel.

At 1320, the given time measurement may be optionally multiplied by 12, or this may be performed at 1335. The given time measurement may be added to and accumulated in a running total of the N time measurements in a first accumulator in order to generate the first sampled window for input into a least squares estimation.

At 1325, the given time measurement may be multiplied with a respective factor, such as the index of the given time measurement, to generate a given product. The given product may be added and accumulated into a running total of products in a second accumulator to generate a second sampled window for input into a least squares estimation.

At 1330, it may be determined whether the counter has reached N−1, indicating that N time measurements have been received. If so, method 1300 may proceed to 1335. Otherwise, method 1300 may return to 1310.

At 1335, the frequency or the period of the clock signal may be estimated based on the first and second sampled windows. A switch may be caused to output the values of the accumulators in the form of the sampled windows to an estimation circuit to make the estimation. The first sampled window may be multiplied by a least squares factor (12), if not done so in 1320, to yield a first term. The second sampled window may be multiplied by a least squares factor (6(N−1)) to yield a second term. The multiplied first sampled window may be subtracted from the multiplied second sampled window to yield a third term. N may be applied to the results by dividing the third term by (N(N^2−1)) to estimate frequency or period of the clock signal.

Figure 14:
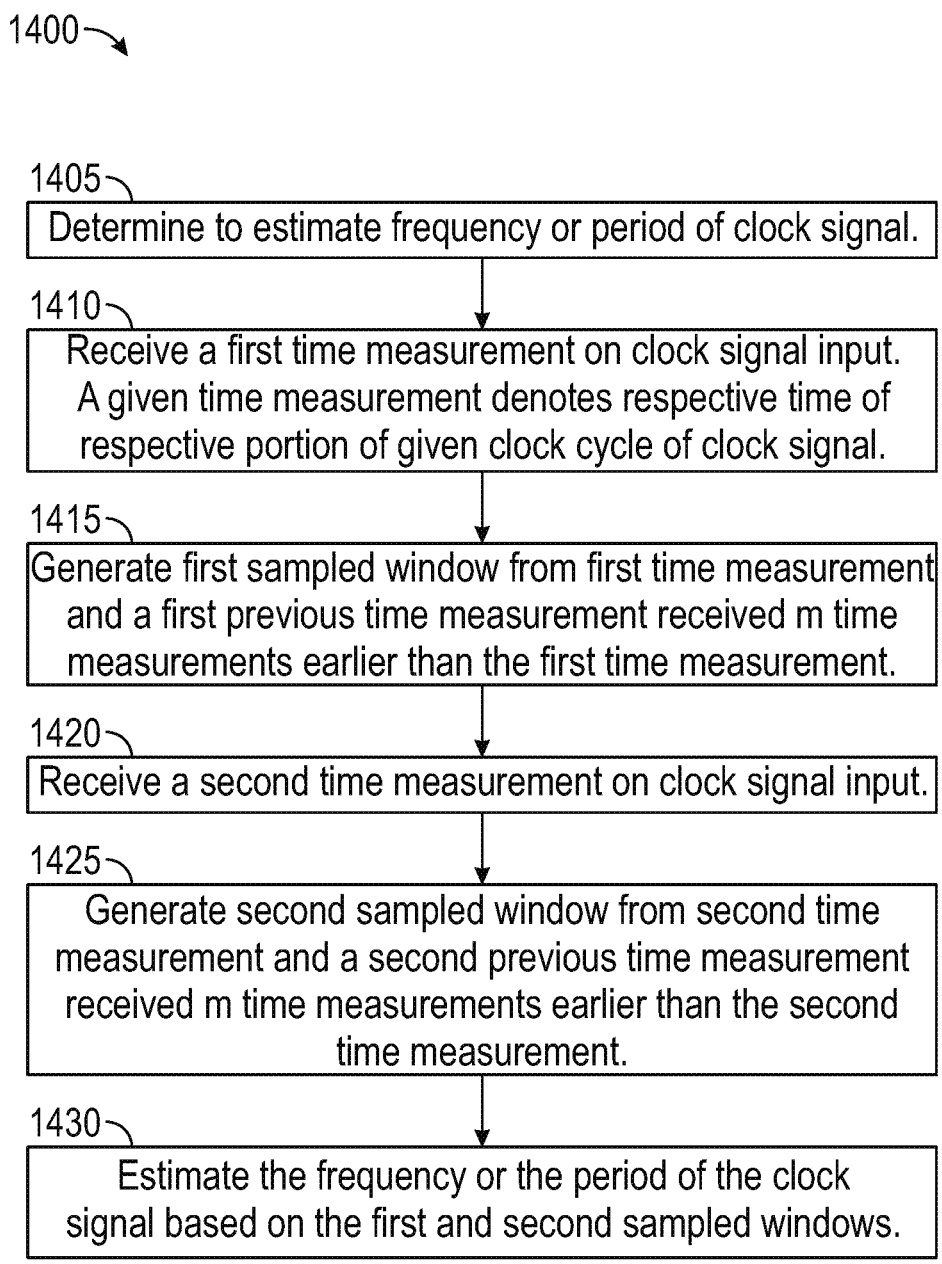
FIG. 14 is an illustration of a method for estimating a clock signal using comparisons of time measurements with previously made time measurements, according to examples of the present disclosure.

FIG. 14 is an illustration of a method 1400 for estimating a clock signal using comparisons of time measurements with previously made time measurements, according to examples of the present disclosure. Method 1400 may illustrate operation of or be implemented by any suitable apparatus, such as the elements of FIGS. 4-7. Method 1400 may begin or end at any suitable point. Method 1400 may include more or fewer steps than shown, and the steps of method 1400 may be optionally repeated, omitted, performed in a different order, performed recursively or in parallel with one another, or recursively or in parallel with another instance of method 1400.

At 1405, it may be determined to estimate the frequency or period of a clock signal.

At 1410, a first time measurement may be received on a clock signal input. A given time measurement denotes respective time of respective portion of given clock cycle of clock signal.

At 1415, a first sampled window may be generated from the first time measurement and a first previous time measurement received m time measurements earlier than the first time measurement.

At 1420, a second time measurement may be received on a clock signal input.

At 1425, a second sampled window may be generated from the second time measurement and a second previous time measurement received m time measurements earlier than the second time measurement.

At 1430, the frequency or the period of the clock signal may be estimated based on the first and second sampled windows.

Figure 15:
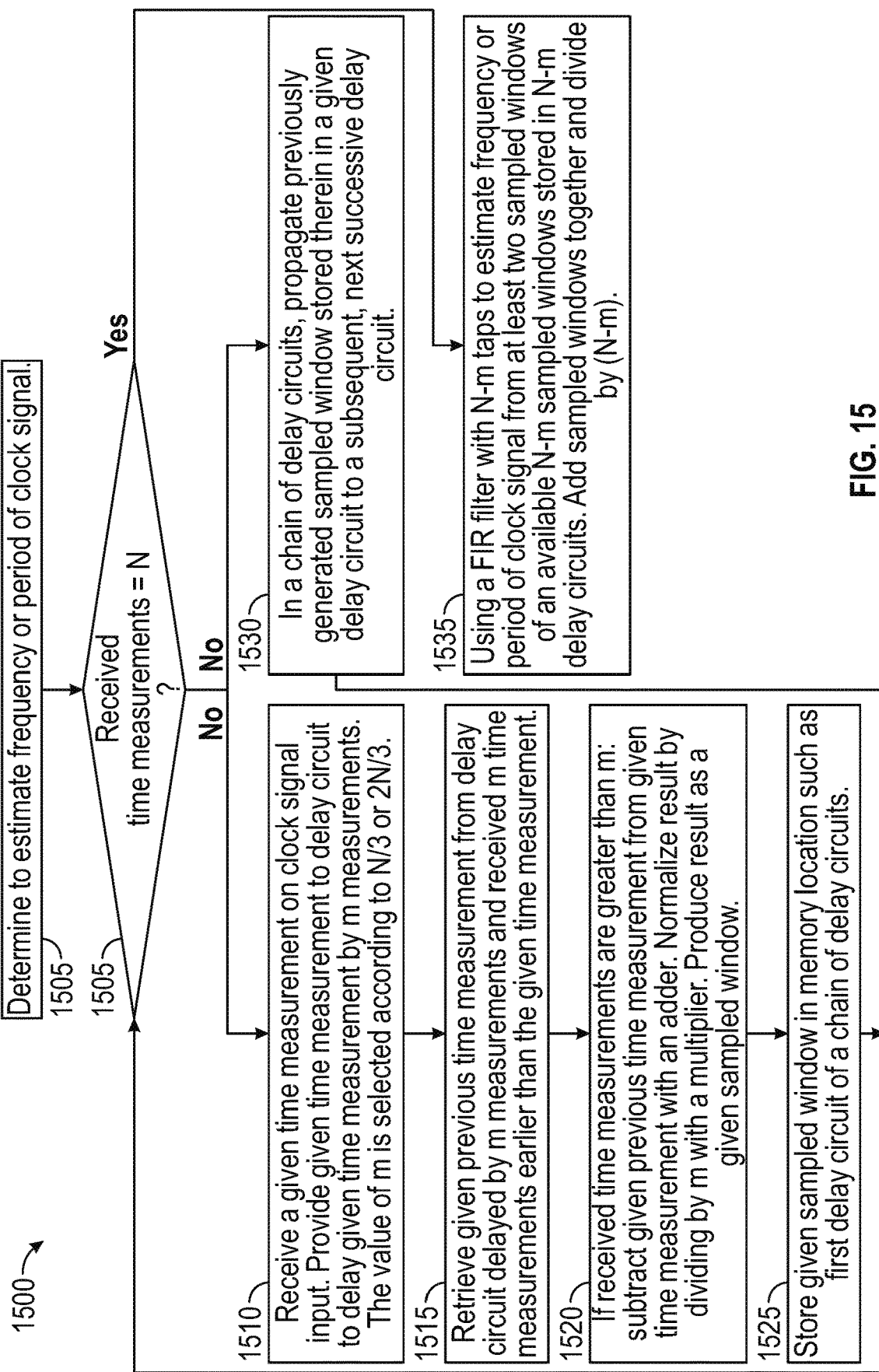
FIG. 15 is a more detailed illustration of a method for estimating a clock signal using comparisons of time measurements with previously made time measurements, according to examples of the present disclosure.

FIG. 15 is a more detailed illustration of a method 1500 for estimating a clock signal using comparisons of time measurements with previously made time measurements, according to examples of the present disclosure. Method 1500 may illustrate operation of or be implemented by any suitable apparatus, such as the elements of FIGS. 4-7, specifically FIG. 5. Method 1500 may be a more detailed illustration of the method of FIG. 14. Method 1500 may begin or end at any suitable point. Method 1500 may include more or fewer steps than shown, and the steps of method 1500 may be optionally repeated, omitted, performed in a different order, performed recursively or in parallel with one another, or recursively or in parallel with another instance of method 1500.

At 1505, it may be determined to estimate the frequency or period of a clock signal. Accumulators and counters and switches may be reset. The counter may be to count an index of a number of received time measurements such that a first received time measurement is indexed at zero.

At 1510, it may be determined whether N time measurements have been received. If so, method 1500 may proceed to 1535. Otherwise, method 1500 may proceed to 1510 and 1530, which may be performed in parallel.

At 1510, a given time measurement may be received on a clock signal input. The given time measurement may be provided to a delay circuit to delay given time measurement by m measurements. The value of m may be selected according to N/3 or 2N/3.

The given time measurement of N time measurements may be received on a clock signal input. A given time measurement may denote a respective time of a respective portion, such as a rising edge, of a given clock cycle of the clock signal input.

At 1515, a given previous time measurement may be retrieve from the delay circuit delayed by m measurements and received m time measurements earlier than the given time measurement.

At 1520, if the received time measurements are greater than m, then subtract the given previous time measurement from the given time measurement with an adder. Normalize result by dividing by m with a multiplier. Produce result as a given sampled window.

At 1525, a given sampled window may be stored in memory location such as first delay circuit of a chain of delay circuits. Method 1500 may return to 1505.

At 1530, in a chain of delay circuits, a previously generated sampled window stored therein in a given delay circuit may be propagated to a subsequent, next successive delay circuit. Method 1500 may return to 1505.

1535, using a FIR filter with N−m taps, the frequency or period of a clock signal may be estimated from at least two sampled windows of an available N−m sampled windows stored in N−m delay circuits. The sampled windows may be added together and divided by the number of sampled windows such as (N−m).

Figure 16:
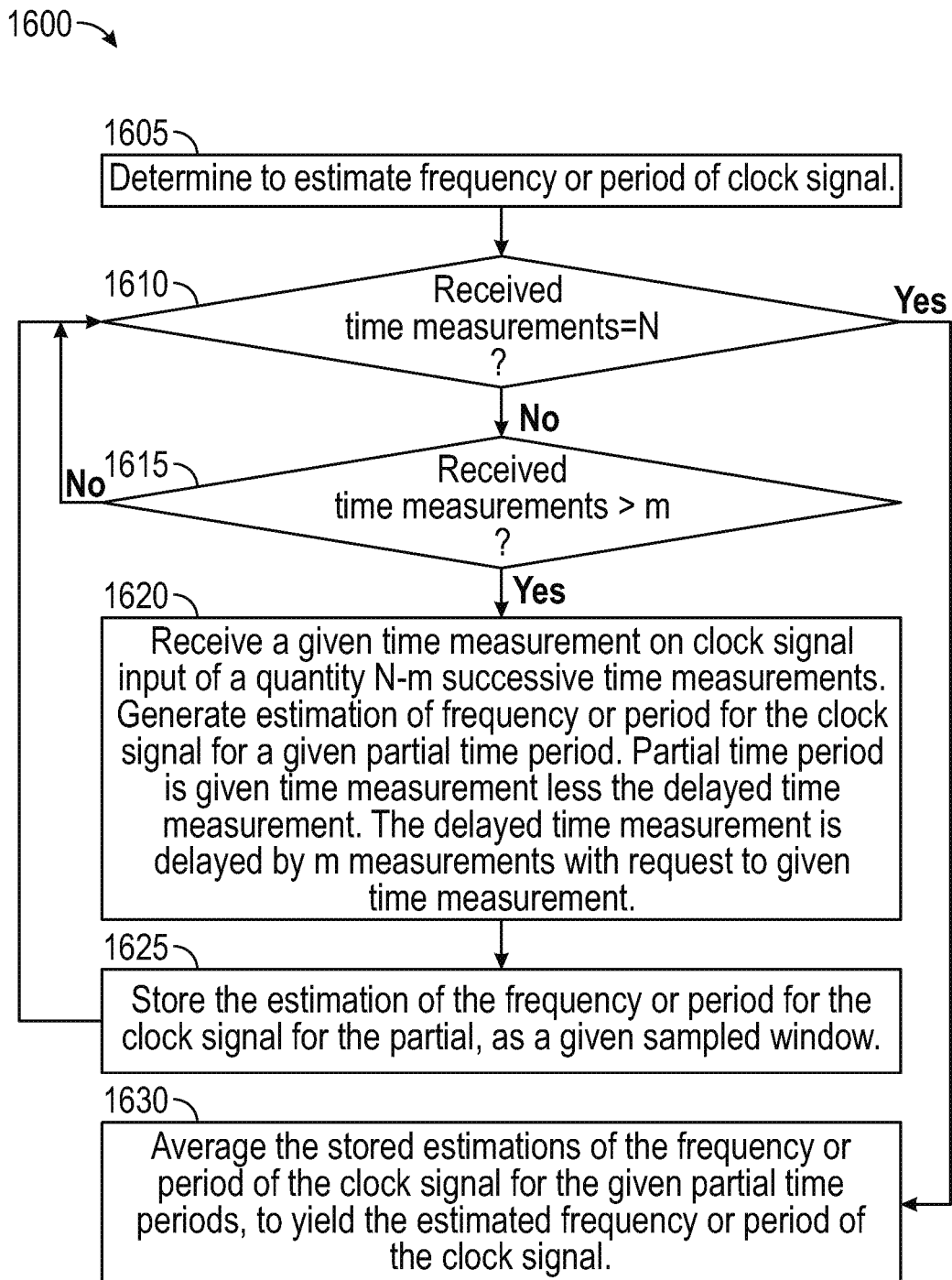
FIG. 16 is yet another more detailed illustration of a method for estimating a clock signal using comparisons of time measurements with previously made time measurements, according to examples of the present disclosure.

FIG. 16 is an illustration of yet another more detailed method 1600 for estimating a clock signal using comparisons of time measurements with previously made time measurements, according to examples of the present disclosure. Method 1600 may illustrate operation of or be implemented by any suitable apparatus, such as the elements of FIGS. 4-7, specifically FIG. 6. Method 1600 may be a more detailed illustration of the method of FIG. 14 or FIG. 15. Method 1600 may begin or end at any suitable point. Method 1600 may include more or fewer steps than shown, and the steps of method 1600 may be optionally repeated, omitted, performed in a different order, performed recursively or in parallel with one another, or recursively or in parallel with another instance of method 1600.

At 1605, it may be determined to estimate the frequency or period of a clock signal. Accumulators and counters and switches may be reset. The counter may be to count an index of a number of received time measurements such that a first received time measurement is indexed at zero.

At 1610, it may be determined whether N time measurements have been received. If so, method 1600 may proceed to 1630. Otherwise, method 1600 may proceed to 1615.

At 1615, it may be determined whether more than m time measurements have been received. If so, method 1600 may proceed to 1620. Otherwise, method 1600 may proceed to 1610.

At 1620, a given time measurement on a clock signal input of a quantity N-m successive time measurements may be received. A frequency or period for the clock signal for a given partial time period may be estimated. The partial time period may be the given time measurement less the delayed time measurement. The delayed time measurement may be delayed by m measurements with respect to given time measurement. The period for the given partial time period may be the partial time period divided by m.

At 1625, the estimation of the frequency or period for the clock signal for the partial time period may be stored as a given sampled window. Method 1600 may return to 1610.

At 1630, the stored estimations of the frequency or period of the clock signal for the given partial time periods may be averaged to yield the estimated frequency or period of the clock signal.

Figure 17:
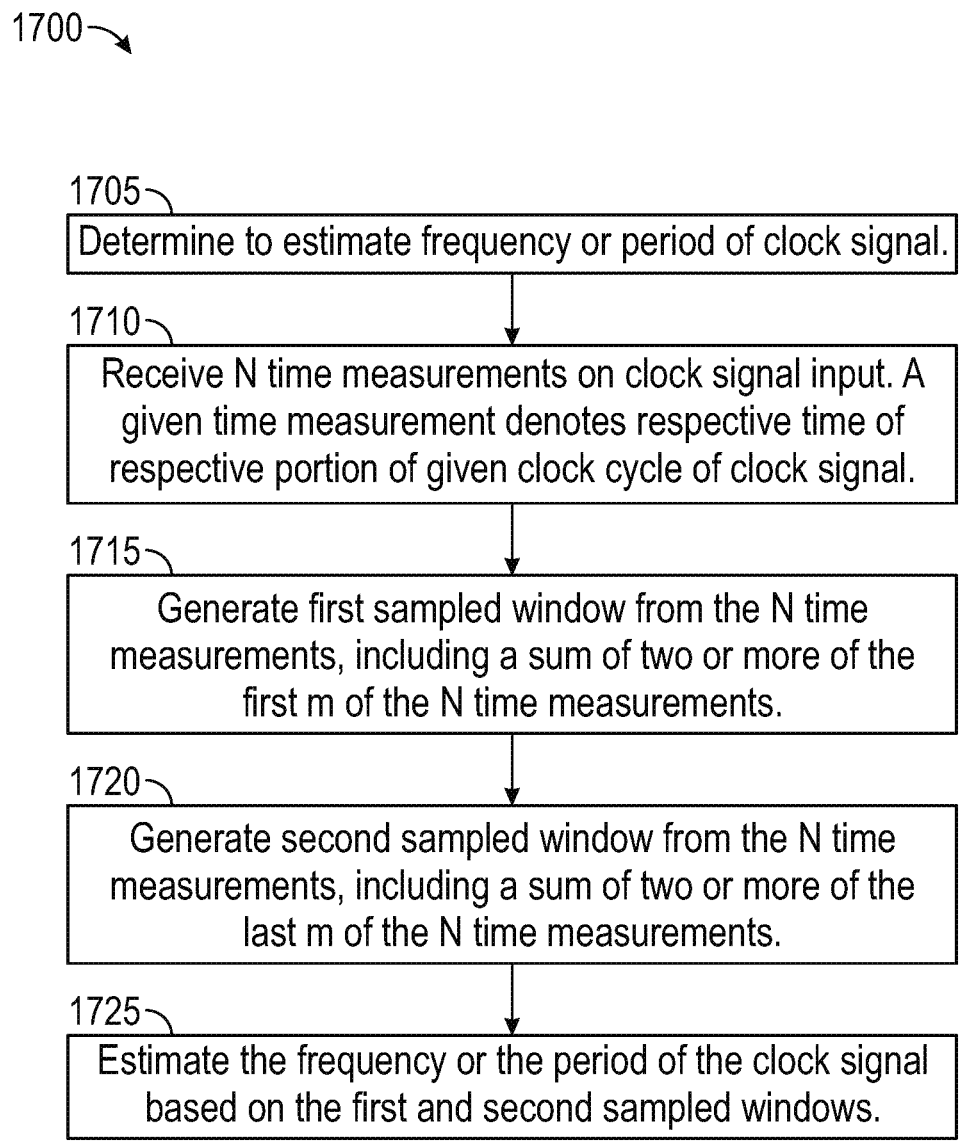
FIG. 17 is an illustration of a method for estimating a clock signal by evaluating the first m samples and last m samples of a set of N time measurements, according to examples of the present disclosure.

FIG. 17 is an illustration of a method 1700 for estimating a clock signal, according to examples of the present disclosure. Method 1700 may illustrate operation of or be implemented by any suitable apparatus, such as the elements of FIGS. 8-11. Method 1700 may begin or end at any suitable point. Method 1700 may include more or fewer steps than shown, and the steps of method 1700 may be optionally repeated, omitted, performed in a different order, performed recursively or in parallel with one another, or recursively or in parallel with another instance of method 1700.

At 1705, it may be determined to estimate the frequency or period of a clock signal.

At 1710, receive N time measurements on a clock signal input. A given time measurement may denote a respective time of respective portion of given clock cycle of clock signal.

At 1715, a first sampled window may be generated from the N time measurements, including a sum of two or more of the first m of the N time measurements.

At 1720, a second sampled window may be generated from the N time measurements, including a sum of two or more of the last m of the N time measurements.

At 1725, the frequency or the period of the clock signal may be estimated based on the first and second sampled windows.

Figure 18:
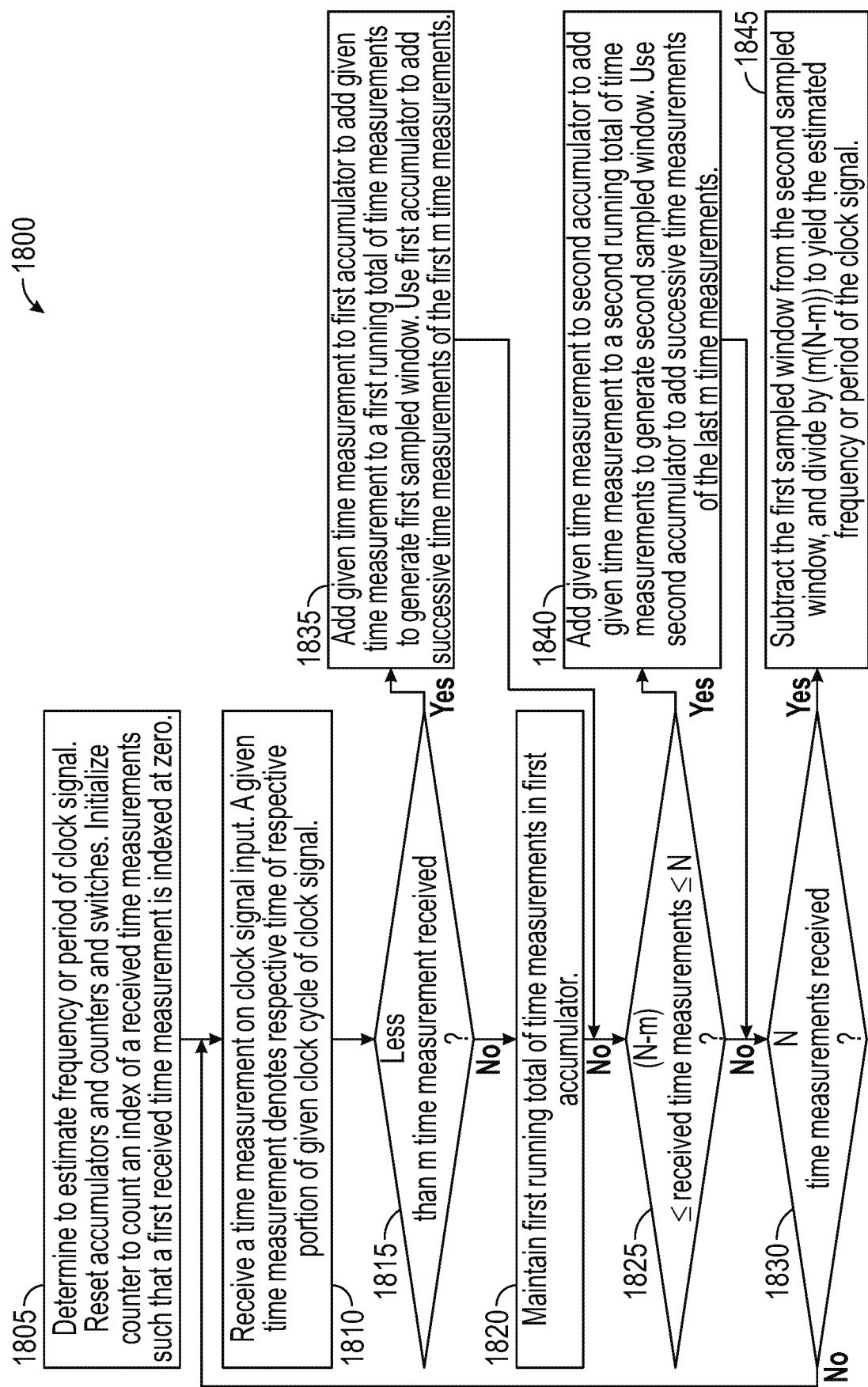
FIG. 18 is a more detailed illustration of a method for estimating a clock signal by evaluating the first m samples and last m samples of a set of N time measurements, according to examples of the present disclosure.

FIG. 18 is an illustration of a method 1800 for estimating a clock signal, according to examples of the present disclosure. Method 1800 may illustrate operation of or be implemented by any suitable apparatus, such as the elements of FIGS. 8-11, specifically FIGS. 9-10. Method 1800 may be a more detailed illustration of the method of FIG. 17. Method 1800 may begin or end at any suitable point. Method 1800 may include more or fewer steps than shown, and the steps of method 1800 may be optionally repeated, omitted, performed in a different order, performed recursively or in parallel with one another, or recursively or in parallel with another instance of method 1800.

At 1805, it may be determined to estimate the frequency or period of a clock signal. Accumulators and counters and switches may be reset. The counter may be to count an index of a number of received time measurements such that a first received time measurement is indexed at zero.

At 1810, a given time measurement may be received on a clock signal input. A given time measurement may denote respective time of respective portion of given clock cycle of clock signal.

At 1815, it may be determined whether less than m time measurements have been received. If so, method 1800 may proceed to 1835. Otherwise, method 1800 may proceed to 1820.

At 1820, a first running total of time measurements may be maintained in a first accumulator.

At 1825, it may be determined whether the number of received measurements is greater than or equal to N−m but less than or equal to N. If so, method 1800 may proceed to 1840. Otherwise, method 1800 may proceed to 1830.

At 1830, it may be determined whether N time measurements have been received. If so, method 1800 may proceed to 1845. Otherwise, method 1800 may proceed to 1810.

At 1835, a given time measurement may be added to a first accumulator to add the given time measurement to a first running total of time measurements to generate first sampled window. The first accumulator may be used to add successive time measurements of the first m time measurements. Method 1800 may proceed to 1825.

At 1840, a given time measurement may be added to a second accumulator to add the given time measurement to a second running total of time measurements to generate second sampled window. The second accumulator may be used to add successive time measurements of the last m time measurements. Method 1800 may proceed to 1830.

At 1845, the first sampled window may be subtracted from the second sampled window, and divide by (m(N−m)) to yield the estimated frequency or period of the clock signal.

In FIG. 18, if m is less than N/2, a single accumulator may be used, wherein the references to the first accumulator and the second accumulator may be a same accumulator.

Figure 19A:
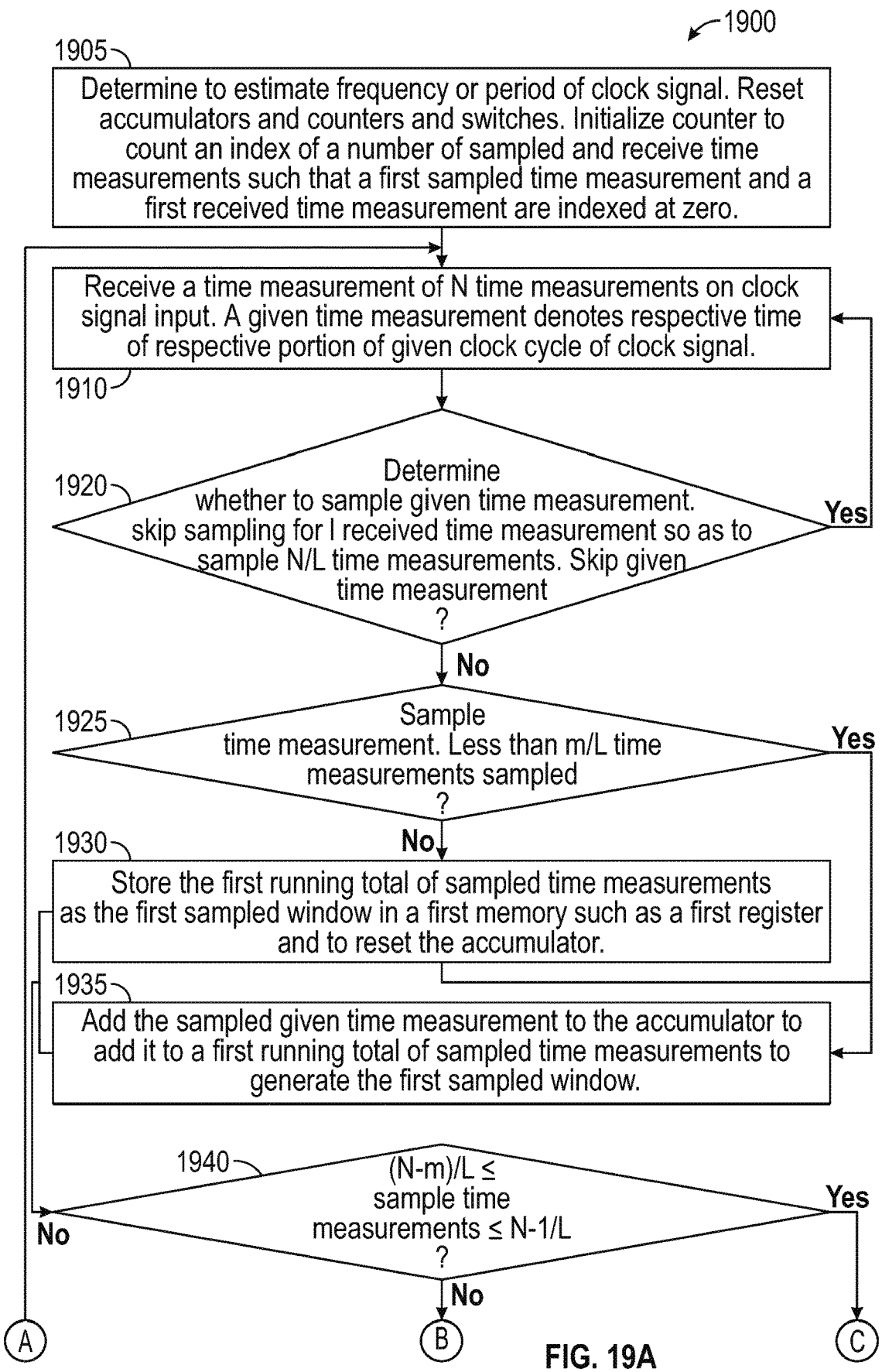
FIGS. 19A and 19B an illustration of a method for estimating a clock signal by evaluating the first m samples and last m samples of a set of N time measurements and skipping L measurements, according to examples of the present disclosure.
Figure 19B:
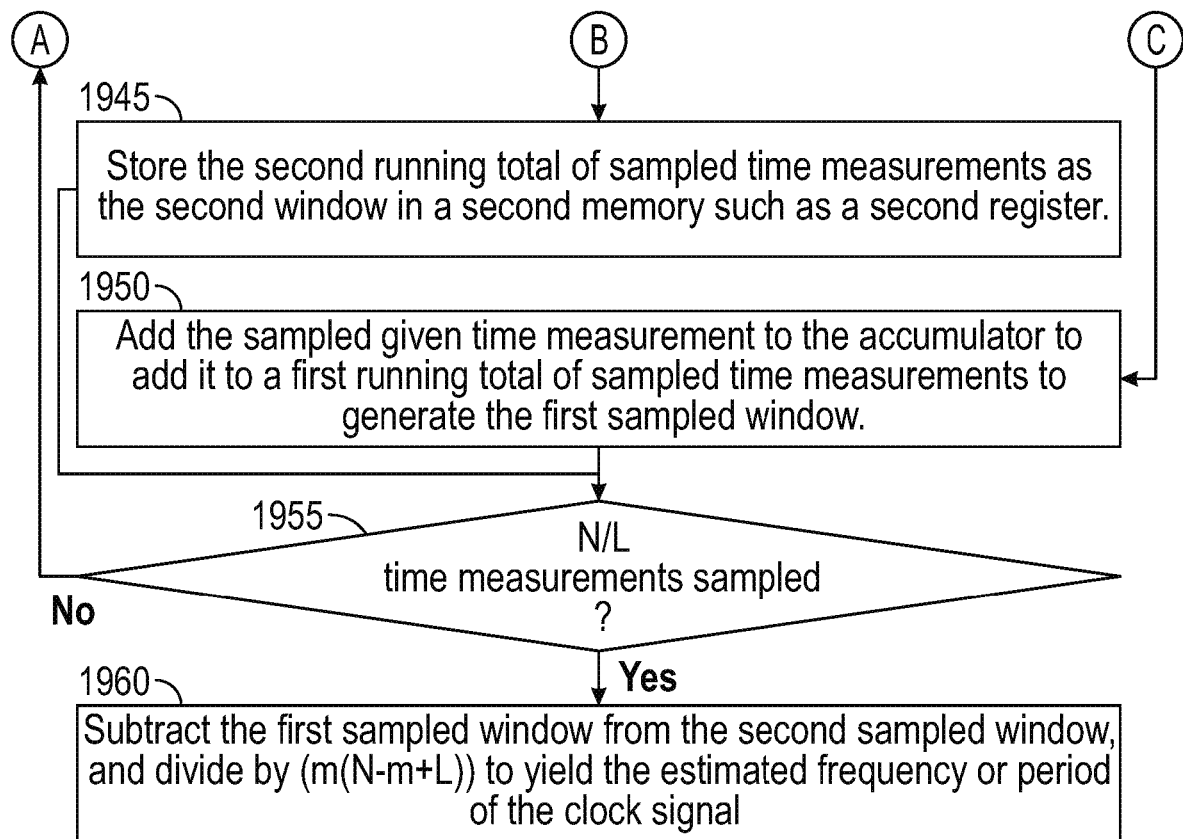

FIGS. 19A and 19B are an illustration of a method 1900 for estimating a clock signal, according to examples of the present disclosure. Method 1900 may illustrate operation of or be implemented by any suitable apparatus, such as the elements of FIGS. 8-11, specifically FIG. 11. Method 1900 may be a more detailed illustration of the method of FIG. 17 or FIG. 18. Method 1900 may begin or end at any suitable point. Method 1800 may include more or fewer steps than shown, and the steps of method 1900 may be optionally repeated, omitted, performed in a different order, performed recursively or in parallel with one another, or recursively or in parallel with another instance of method 1900.

At 1905, it may be determined to estimate the frequency or period of a clock signal. Accumulators and counters and switches may be reset. The counter may count an index of a number of sampled and received time measurements such that a first sampled time measurement and a first received time measurement are indexed at zero.

At 1910, a given time measurement may be received on a clock signal input. A given time measurement may denote respective time of respective portion of given clock cycle of clock signal.

At 1920, it may be determined whether to sample given time measurement. Samples may be skipped for L received time measurements after a last sampled time measurement so as to sample N/L time measurements over the course of N received time measurements. If samples are to be skipped, method 1900 may proceed to 1910. Otherwise, method 1900 may proceed to 1925.

At 1925, the time measurement may be sampled. It may be determined whether less than m/L time measurements have been sampled. If so, method 1900 may proceed to 1935. Otherwise, method 1900 may proceed to 1930.

At 1930, a first running total of sampled time measurements may be stored as a first sampled window in a first memory such as a first register and to reset the accumulator.

At 1935, the sampled given time measurement may be added to the accumulator to add it to a first running total of sampled time measurements to generate the first sampled window.

At 1940, it may be determined whether more than (N−m)/L samples have been taken but less than (N−1)/L. If so, method 1900 may proceed to 1950. Otherwise, method 1900 may proceed to 1945.

At 1945, a second running total of sampled time measurements may be stored as a second sampled window in a first memory such as a second register and to reset the accumulator.

At 1950, the sampled given time measurement may be added to the accumulator to add it to a second running total of sampled time measurements to generate the second sampled window.

At 1955, it may be determined whether N/L time measurements have bene sampled. If so, method 1900 may proceed to 1960. Otherwise, method 1900 may proceed to 1910.

At 1960, the first sampled window may be subtracted from the second sampled window, and divide by (m(N−m+L)) to yield the estimated frequency or period of the clock signal.

Examples of the present disclosure may include an apparatus. The apparatus may include a clock signal input to receive N time measurements to estimate a frequency or period of a clock signal. A time measurement of the N time measurements may be to denote a respective time of a respective portion of a given cycle of a clock signal. The clock signal may include a frequency or period to be estimated over the N time measurements.

The apparatus may include a sampling circuit. The sampling circuit may be to, upon reception of a first time measurement on the clock signal input, generate a first sampled window from the clock signal input. The first sampled window may be based upon the first time measurement and a first previous time measurement. The first previous time measurement may be a time measurement which was received m time measurements earlier than the first time measurement, wherein m is greater than one. The sampling circuit may, upon reception of a second time measurement on the clock signal input, generate a second sampled window from the clock signal input. The second sampled window may be based upon the second time measurement and a second previous time measurement. The second previous time measurement a time measurement may be received m time measurements earlier than the second time measurement. The second time measurement may be subsequent to the first time measurement.

The estimation circuit may estimate the frequency or period of the clock signal based upon the first sampled window and the second sampled window.

In combination with any of the above examples, the sampling circuit may include a delay circuit to delay the first previous time measurement by m measurements.

In combination with any of the above examples, the sampling circuit may be to, upon reception of the first time measurement, subtract the first previous time measurement from the first time measurement to obtain the first sampled window, and store the first sampled window in a first memory location. Upon reception of the second time measurement, the sampling circuit may subtract the second previous time measurement from the second time measurement to obtain the second sampled window and store the second sampled window in a second memory location.

In combination with any of the above examples, the sampling circuit may divide a value of subtracting the first previous time measurement from the first time measurement by a number of delayed measurements m to obtain the first sampled window.

In combination with any of the above examples, the first memory location may be a delay circuit in a chain of delay circuits. The delay circuit may propagate its value to a subsequent delay circuit in the chain of delay circuits upon a reception of a given time measurement on the clock signal input.

In combination with any of the above examples, the second memory location may be the delay circuit in the chain of delay circuits. The sampling circuit may store the first sampled window in the delay circuit upon reception of the first time measurement on the clock signal input. The delay circuit may propagate the first sampled window to a next delay circuit upon reception of the second time measurement on the clock signal input. The sampling circuit may store the second sampled window in the delay circuit upon reception of the second time measurement on the clock signal input.

In combination with any of the above examples, the sampling circuit may generate a quantity (N–m) sampled windows to make the estimation.

In combination with any of the above examples, the estimation circuit includes a finite impulse response (FIR) filter to estimate, from at least the first sampled window and the second sampled window, the frequency or period of the clock signal.

In combination with any of the above examples, the FIR filter may include a quantity of (N–m) taps.

In combination with any of the above examples, the sampling circuit may generate a given sampled window upon reception of a given time measurement on the clock signal input of a quantity (N–m) successive time measurements received on the clock signal input. The given sampled window may include the first sampled window and the second sampled window. The sampling circuit may store the given sampled window in a delay circuit of a chain of delay circuits. Upon reception the given time measurement on the clock signal input of a quantity (N–m) successive time measurements received on the clock signal input, the delay circuit may propagate a previously given sampled window to a next successive delay circuit in the chain of delay circuits. After reception of N successive time measurements on the clock signal input, the estimation circuit may use (N–m) sampled windows from (N–m) delay circuits in the chain of delay circuits to estimate the frequency or period of the clock signal.

In combination with any of the above examples, upon reception of a given time measurement on the clock signal input of a quantity (N–m) successive time measurements received on the clock signal input, the sampling circuit may generate an estimation of a frequency or period of the clock signal for a given partial time period. The given partial time period between the given time measurement and a delayed time measurement may be delayed by m measurements with respect to the given time measurement. The sampling circuit may store the estimation of the frequency or period of the clock signal for the given partial time period. Upon reception of a quantity N successive time measurements on the clock signal input, the estimation circuit may average stored estimations of the frequency or period of the clock signal for the given partial time periods.

In combination with any of the above examples, m may be selected according to N/3 or 2N/3.

Alone or in combination with any of the above examples, examples of the present disclosure may include an apparatus with a clock signal input to receive N time measurements to estimate a frequency or period of a clock signal. A time measurement of the N time measurements may be to denote a respective time of a respective portion of a given cycle of a clock signal. The clock signal may include a frequency or period to be estimated over the N time measurements.

The apparatus may include a sampling circuit to generate a first sampled window from the clock signal input. The first sampled window may include a sum of a plurality of a first m of the N time measurements. The sampling circuit may generate a second sampled window from the clock signal input. The second sampled window may include a sum of a plurality of a last m of the N time measurements. The apparatus may include an estimation circuit to estimate the frequency or period of the clock signal based upon the first sampled window and the second sampled window.

In combination with any of the above examples, the sampling circuit may include a first accumulator to generate the first sampled window and a second accumulator to generate the second sampled window.

In combination with any of the above examples, m may be greater than N/2.

In combination with any of the above examples, the apparatus may include a counter to count time measurements as they are received on the clock signal input. Upon reception of a given time measurement on the clock signal input, if less than m time measurements have been received, the first accumulator may add the given time measurement to a first running total of time measurements to generate the first sampled window. Upon reception of a given time measurement on the clock signal input, if m or greater time measurements have been received, the first accumulator may maintain the first running total of time measurements. Upon reception of a given time measurement on the clock signal input, if (N–m) or greater time measurements and less than or equal to N time measurements have been received, the second accumulator may add the given time measurement to a second running total of time measurements to generate the second sampled window.

In combination with any of the above examples, the sampling circuit may include an accumulator to add successive time measurements of the first m of the N time measurements to generate the first sampled window.

In combination with any of the above examples, m is less than N/2 and the sampling circuit may include an accumulator to first generate the first sampled window and to then generate the second sampled window.

In combination with any of the above examples, the apparatus may include a counter to count time measurements as they are received on the clock signal input, wherein, upon reception of a given time measurement on the clock signal input, if the counter indicates that less than m time measurements have been received, an accumulator may add the given time measurement to a first running total of time measurements to generate the first sampled window. Upon reception of a given time measurement on the clock signal input, if the counter indicates that m time measurements have been received, the sampling circuit may store the first running total of time measurements as the first sampled window in a first memory and to reset the accumulator. Upon reception of a given time measurement on the clock signal input, if the counter indicates that a quantity of time measurements greater than or equal to (N−m) but less than N has been received, the accumulator may add the given time measurement to a second running total of time measurements. Upon reception of a given time measurement on the clock signal input, if the counter indicates that N time measurements have been received, the sampling circuit may store the second running total of time measurements as the second sampled window in a second memory.

In combination with any of the above examples, the accumulator may accumulate the first m time measurements and store an accumulation of the first m time measurements in a first memory as the first sampled window, and accumulate the last m time measurements and store an accumulation of the last m time measurements in a second memory as the second sampled window.

In combination with any of the above examples, the estimation circuit may, upon the sampling circuit reception of N time measurements, subtract the first sampled window from the second sampled window, and apply a result from the subtraction to a multiplication factor of $1/(m(N-m))$ to yield an estimated frequency or period of the clock signal.

In combination with any of the above examples, the sampling circuit may sample a given time measurement and to skip sampling of a next L time measurements after the given time measurement and to exclude the next L time measurements from generation of the first sampled window and the second sampled window.

In combination with any of the above examples, the sampling circuit may sample N/L time measurements of the N time measurements.

In combination with any of the above examples, the sampling circuit may accumulate a first quantity (m/L) of sampled time measurements of the N time measurements and store the first quantity (m/L) of sampled time measurements in a first memory as the first sampled window. The sampling circuit may accumulate a last quantity (m/L) of sampled time measurements of the N time measurements and store the last quantity (m/L) of sampled time measurements in a second memory as the second sampled window.

In combination with any of the above examples, the apparatus may include an accumulator to first generate the first sampled window and to then generate the second sampled window. The apparatus may include a counter to count sampled time measurements as they are sampled by the sampling circuit. The sampling circuit may, upon sampling a given time measurement on the clock signal input, if the counter indicates that less than m/L time measurements have been sampled, use the accumulator to add the sampled given time measurement to a first running total of sampled time measurements to generate the first sampled window. Upon sampling a given time measurement on the clock signal input, once the counter indicates that m/L or more time measurements have been sampled, the sampling circuit may store the first running total of sampled time measurements as the first sampled window in a first memory and to reset the accumulator. Upon sampling a given time measurement on the clock signal input, if the counter indicates that greater than (N−m)/L time measurements but less than (N−1)/L time measurements have been sampled, the accumulator may add the sampled given time measurement to a second running total of sampled time measurements. Upon sampling a given time measurement on the clock signal input, if the counter indicates that N/L or more time measurements have been sampled, the sampling circuit may store the second running total of sampled time measurements as the second sampled window in a second memory.

In combination with any of the above examples, the estimation circuit may, upon the sampling circuit sampling N/L or more time measurements, subtract the first sampled window from the second sampled window, and to apply a result to a multiplication factor of $1/(m(N-m+L))$ to yield an estimated frequency or period of the clock signal.

Alone or in combination with any of the above examples, examples of the present disclosure may include an apparatus with a clock signal input to receive N time measurements to estimate a frequency or period of a clock signal. A time measurement of the N time measurements may be to denote a respective time of a respective portion of a given cycle of a clock signal. The clock signal may include a frequency or period to be estimated over the N time measurements.

The apparatus may include a sampling circuit to generate a first sampled window from the clock signal input. The first sampled window may include an accumulation of the N time measurements. The sampling circuit may generate a second sampled window from the clock signal input. The second sampled window may include an accumulation of a plurality of products, wherein a given product is a product of one of the N time measurements and a respective factor. The apparatus may include an estimation circuit to estimate the frequency or period of the clock signal based upon the first sampled window and the second sampled window.

In combination with any of the above examples, the sampling circuit may generate the first sampled window and the second sampled window for input into a least squares estimation by the estimation circuit.

In combination with any of the above examples, the sampling circuit may, upon reception of a given time measurement on the clock signal input, accumulate the given time measurement into a running total of the N time measurements in a first accumulator to generate the first sampled window.

In combination with any of the above examples, the sampling circuit may, upon reception of a given time measurement on the clock signal input, increment an index of received time measurements to generate the respective factor, multiply the given time measurement with the index to generate a given product, and accumulate the given product into a running total of products in a second accumulator to generate the second sampled window.

In combination with any of the above examples, the sampling circuit may, upon reception of N time measurements, multiply the second sampled window by a least squares factor and provide the first sampled window and the second sampled window to the estimation circuit.

In combination with any of the above examples, estimation circuit may, upon reception of the first sampled window and the second sampled window, subtract the first sampled window from the second sampled window to yield a result and apply N to the result to estimate the frequency or period of the clock signal.

In combination with any of the above examples, the apparatus may include a counter, a comparator, a first accumulator, a second accumulator, and a switch. The counter may count an index of a number of received time measurements, a first received time measurement indexed at zero. The comparator may evaluate whether the index of the number of received time measurements has reached N−1 and to provide the evaluation to the switch. For a given received time measurement, the sampling circuit may multiply the index with the received time measurement and store a result in the first accumulator. For a given received time measurement, the sampling circuit may accumulate the received time measurement in the second accumulator. Upon reaching N time measurements, the switch may cause an output of the first accumulator and an output of the second accumulator to be provided to the estimation circuit. Upon reaching N time measurements, the estimation circuit may multiply the output of the first accumulator by 12 to yield a first term, multiply the output of the second accumulator by 6(N−1) to yield a second term, subtract the first term from the second term to yield a third term, and divide the third term by $(N(N^2-1))$ to estimate the frequency or period of the clock signal.

In combination with any of the above examples, the apparatus may include a counter, a comparator, a first accumulator, a second accumulator, and a switch. The counter may count an index of a number of received time measurements. A first received time measurement may be indexed at zero. The comparator may evaluate whether the index of the number of received time measurements has reached N−1 and to provide the evaluation to the switch. For a given received time measurement, the sampling circuit may multiply the index with the received time measurement and by 12 and store a result in the first accumulator. For a given received time measurement, the sampling circuit may accumulate the received time measurement in the second accumulator. Upon reaching N time measurements, the switch may cause an output of the first accumulator and an output of the second accumulator to be provided to the estimation circuit. Upon reaching N time measurements, the estimation circuit may multiply the output of the second accumulator by 6(N−1) to yield a first term, subtract the output of the first accumulator from the first term to yield a second term, and divide the second term by $(N(N^2-1))$ to estimate the frequency or period of the clock signal.

Although example embodiments have been described above, other variations and embodiments may be made from this disclosure without departing from the spirit and scope of these embodiments.

We claim:

1. An apparatus, comprising:
a clock signal input to receive N time measurements, a time measurement of the N time measurements to denote a respective time of a respective portion of a given cycle of a clock signal, the clock signal to include a frequency or period to be estimated over the N time measurements;
a sampling circuit to:
generate a first sampled window from the clock signal input, the first sampled window including an accumulation of the N time measurements; and
generate a second sampled window from the clock signal input, the second sampled window including an accumulation of a plurality of products, wherein a given product is a product of one of the N time measurements and a respective factor; and
an estimation circuit to estimate the frequency or period of the clock signal based upon the first sampled window and the second sampled window.

2. The apparatus of claim 1, wherein the sampling circuit is to generate the first sampled window and the second sampled window for input into a least squares estimation by the estimation circuit.

3. The apparatus of claim 1, wherein the sampling circuit is to, upon reception of a given time measurement on the clock signal input, accumulate the given time measurement into a running total of the N time measurements in a first accumulator to generate the first sampled window.

4. The apparatus of claim 1, wherein the sampling circuit is to, upon reception of a given time measurement on the clock signal input:
increment an index of received time measurements to generate the respective factor;
multiply the given time measurement with the index to generate a given product; and
accumulate the given product into a running total of products in a second accumulator to generate the second sampled window.

5. The apparatus of claim 1, wherein the sampling circuit is to, upon reception of N time measurements, multiply the second sampled window by a least squares factor and provide the first sampled window and the second sampled window to the estimation circuit.

6. The apparatus of claim 1, wherein the estimation circuit is to, upon reception of the first sampled window and the second sampled window, subtract the first sampled window from the second sampled window to yield a result and apply N to the result to estimate the frequency or period of the clock signal.

7. The apparatus of claim 1, comprising a counter, a comparator, a first accumulator, a second accumulator, and a switch, wherein:
the counter is to count an index of a number of received time measurements, a first received time measurement indexed at zero;
the comparator is to evaluate whether the index of the number of received time measurements has reached N−1 and to provide the evaluation to the switch;
for a given received time measurement, the sampling circuit is to multiply the index with the received time measurement and store a result in the first accumulator;
for a given received time measurement, the sampling circuit is to accumulate the received time measurement in the second accumulator;
upon reaching N time measurements, the switch is to cause an output of the first accumulator and an output of the second accumulator to be provided to the estimation circuit;
upon reaching N time measurements, the estimation circuit is to:
multiply the output of the first accumulator by 12 to yield a first term;
multiply the output of the second accumulator by 6(N−1) to yield a second term;
subtract the first term from the second term to yield a third term; and
divide the third term by $(N(N^2-1))$ to estimate the frequency or period of the clock signal.

8. The apparatus of claim 1, comprising a counter, a comparator, a first accumulator, a second accumulator, and a switch, wherein:
the counter is to count an index of a number of received time measurements, a first received time measurement indexed at zero;

the comparator is to evaluate whether the index of the number of received time measurements has reached N−1 and to provide the evaluation to the switch;

for a given received time measurement, the sampling circuit is to multiply the index with the received time measurement and by 12 and store a result in the first accumulator;

for a given received time measurement, the sampling circuit is to accumulate the received time measurement in the second accumulator;

upon reaching N time measurements, the switch is to cause an output of the first accumulator and an output of the second accumulator to be provided to the estimation circuit;

upon reaching N time measurements, the estimation circuit is to:
multiply the output of the second accumulator by 6(N−1) to yield a first term;
subtract the output of the first accumulator from the first term to yield a second term; and
divide the second term by (N(N^2−1)) to estimate the frequency or period of the clock signal.

9. A method, comprising:
receiving N time measurements on a clock signal input, a time measurement of the N time measurements to denote a respective time of a respective portion of a given cycle of a clock signal, the clock signal to include a frequency or period to be estimated over the N time measurements;
generating a first sampled window from the clock signal input, the first sampled window including an accumulation of the N time measurements;
generating a second sampled window from the clock signal input, the second sampled window including an accumulation of a plurality of products, wherein a given product is a product of one of the N time measurements and a respective factor; and
estimating the frequency or period of the clock signal based upon the first sampled window and the second sampled window.

10. The method of claim 9, comprising generating the first sampled window and the second sampled window for input into a least squares estimation by the estimation circuit.

11. The method of claim 9, comprising, upon reception of a given time measurement on the clock signal input, accumulating the given time measurement into a running total of the N time measurements in a first accumulator to generate the first sampled window.

12. The method of claim 9, comprising, upon reception of a given time measurement on the clock signal input:
incrementing an index of received time measurements to generate the respective factor;
multiplying the given time measurement with the index to generate a given product; and
accumulating the given product into a running total of products in a second accumulator to generate the second sampled window.

13. The method of claim 9, comprising, upon reception of N time measurements, multiplying the second sampled window by a least squares factor and provide the first sampled window and the second sampled window to the estimation circuit.

14. The method of claim 9, comprising, upon reception of the first sampled window and the second sampled window, subtracting the first sampled window from the second sampled window to yield a result and apply N to the result to estimate the frequency or period of the clock signal.

15. The method of claim 9, comprising:
operating a counter to count an index of a number of received time measurements, a first received time measurement indexed at zero;
operating a comparator to evaluate whether the index of the number of received time measurements has reached N−1 and to provide the evaluation to a switch;
for a given received time measurement, multiplying the index with the received time measurement and store a result in a first accumulator;
for a given received time measurement, accumulating the received time measurement in a second accumulator;
upon reaching N time measurements, operating the switch is to cause an output of the first accumulator and an output of the second accumulator to be provided for estimation; and
upon reaching N time measurements:
multiplying the output of the first accumulator by 12 to yield a first term;
multiplying the output of the second accumulator by 6(N−1) to yield a second term;
subtracting the first term from the second term to yield a third term; and
dividing the third term by (N(N^2−1)) to estimate the frequency or period of the clock signal.

16. The method of claim 9, comprising:
operating a counter to count an index of a number of received time measurements, a first received time measurement indexed at zero;
operating a comparator to evaluate whether the index of the number of received time measurements has reached N−1 and to provide the evaluation to a switch;
for a given received time measurement, multiplying the index with the received time measurement and by 12 and storing a result in a first accumulator;
for a given received time measurement, accumulating the received time measurement in a second accumulator;
upon reaching N time measurements, operating the switch is to cause an output of the first accumulator and an output of the second accumulator to be provided for estimation; and
upon reaching N time measurements:
multiplying the output of the second accumulator by 6(N−1) to yield a first term;
subtracting the output of the first accumulator from the first term to yield a second term; and
dividing the second term by (N(N^2−1)) to estimate the frequency or period of the clock signal.

* * * * *